(12) United States Patent
Cho et al.

(10) Patent No.: US 12,284,881 B2
(45) Date of Patent: *Apr. 22, 2025

(54) DISPLAY DEVICE INCLUDING BUFFER TRANSISTOR OVERLAPPING WITH VALLEY AREA IN PLAN VIEW

(71) Applicant: SAMSUNG DISPLAY CO., LTD., Yongin-si (KR)

(72) Inventors: Youngjin Cho, Seoul (KR); Jisu Na, Yongin-si (KR); Joong-Soo Moon, Hwaseong-si (KR); Yangwan Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/336,904

(22) Filed: Jun. 16, 2023

(65) Prior Publication Data

US 2023/0337481 A1  Oct. 19, 2023

Related U.S. Application Data

(63) Continuation of application No. 17/005,081, filed on Aug. 27, 2020, now Pat. No. 11,683,962.

(30) Foreign Application Priority Data

Dec. 20, 2019 (KR) .................... 10-2019-0171700

(51) Int. Cl.
*H10K 59/124* (2023.01)
*G09G 3/3266* (2016.01)
(Continued)

(52) U.S. Cl.
CPC ......... *H10K 59/124* (2023.02); *G09G 3/3266* (2013.01); *H10K 59/1213* (2023.02); *H10K 59/131* (2023.02)

(58) Field of Classification Search
CPC ............... H10K 59/124; H10K 59/131; H10K 59/1213; G09G 3/3266
See application file for complete search history.

(56) References Cited

U.S. PATENT DOCUMENTS

| 4,599,641 A | 7/1986 | Troiano |
| 8,125,422 B2 | 2/2012 | Choi |

(Continued)

FOREIGN PATENT DOCUMENTS

| KR | 10-2006-0112994 A | 11/2006 |
| KR | 10-2018-0009820 A | 1/2018 |

*Primary Examiner* — Lex H Malsawma
(74) *Attorney, Agent, or Firm* — Womble Bond Dickinson (US) LLP

(57) ABSTRACT

A display device includes: a base layer including an active area and a non-active area adjacent to the active area; a display circuit layer including a pixel circuit at the active area of the base layer, and a driving circuit at the non-active area, the driving circuit to supply a driving signal to the pixel circuit; and a display element layer on the display circuit layer and including light emitting elements to emit light. The non-active area includes a valley area formed by removing a portion of an organic insulation layer at the display circuit layer, the driving circuit includes a buffer transistor to output the driving signal, and the buffer transistor includes a control electrode and a semiconductor layer overlapping the valley area in a plan view.

16 Claims, 16 Drawing Sheets

(51) Int. Cl.
*H10K 59/121* (2023.01)
*H10K 59/131* (2023.01)

(56) References Cited

U.S. PATENT DOCUMENTS

| | | | |
|---|---|---|---|
| 11,683,962 B2* | 6/2023 | Cho | .................... H10K 59/124 257/40 |
| 2006/0158394 A1 | 7/2006 | Choi | |
| 2010/0013823 A1 | 1/2010 | Kwon et al. | |
| 2018/0145125 A1 | 5/2018 | Lee et al. | |
| 2019/0252473 A1 | 8/2019 | Park et al. | |

\* cited by examiner

DISPLAY DEVICE INCLUDING BUFFER TRANSISTOR OVERLAPPING WITH VALLEY AREA IN PLAN VIEW

CROSS-REFERENCE TO RELATED APPLICATIONS

This application is a continuation of U.S. patent application Ser. No. 17/005,081, filed Aug. 27, 2020, which claims priority to and the benefit of Korean Patent Application No. 10-2019-0171700, filed Dec. 20, 2019, the entire content of both of which is incorporated herein by reference.

BACKGROUND

Aspects of one or more example embodiments of the present disclosure relate to a display device, and more particularly, to a display device having a reduced width at a bezel area.

An organic electroluminescence display device includes a display panel for displaying an image. The display panel includes a light emitting element for generating light, and a pixel circuit for driving the light emitting element.

The pixel circuit may be connected to a data driving unit for supplying data voltages, a scan driving unit for supplying gate signals, and a light emission control unit for supplying an emission control signal.

The data driving unit, the scan driving unit, and the emission control unit may be provided at (e.g., in or on) a peripheral region of the display panel.

The above information disclosed in this Background section is for enhancement of understanding of the background of the present disclosure, and therefore, it may contain information that does not constitute prior art.

SUMMARY

One or more example embodiments of the present disclosure are directed to a display device having a reduced width at a bezel area.

According to one or more example embodiments of the present disclosure, a display device includes: a base layer including an active area and a non-active area adjacent to the active area; a display circuit layer including a pixel circuit at the active area of the base layer, and a driving circuit at the non-active area, the driving circuit being configured to supply a driving signal to the pixel circuit; and a display element layer on the display circuit layer and including light emitting elements configured to emit light. The non-active area includes a valley area formed by removing a portion of an organic insulation layer in the display circuit layer, the driving circuit includes a buffer transistor configured to output the driving signal, and the buffer transistor includes a control electrode and a semiconductor layer overlapping the valley area in a plan view.

In an example embodiment, the display circuit layer may include a first organic insulation layer and a second organic insulation layer covering the buffer transistor, and the valley area may include a first valley area formed by removing a portion of the first organic insulation layer, and a second valley area formed by removing a portion of the second organic insulation layer.

In an example embodiment, the first valley area may have a smaller width than that of the second valley area and may be provided in the second valley area, and the control electrode and the semiconductor layer of the buffer transistor may overlap the second valley area in a plan view.

In an example embodiment, the display element layer may further include a pixel definition layer on the second organic insulation layer, and a portion of the pixel definition layer may be removed in correspondence to the valley area.

In an example embodiment, the buffer transistor may include: the semiconductor layer on the base layer; the control electrode on the semiconductor layer; a first electrode connected to a first area of the semiconductor layer; and a second electrode connected to a second area of the semiconductor layer.

In an example embodiment, the first electrode and the second electrode may not overlap with the valley area in a plan view, and the semiconductor layer and the control electrode may partially overlap with the valley area in a plan view.

In an example embodiment, the semiconductor layer may extend parallel to a first direction in which the valley area extends, the first electrode may include a plurality of branch input electrodes arranged along the first direction, the second electrode may include a plurality of branch output electrodes separately arranged along the first direction, and one branch output electrode from among the plurality of branch output electrodes may be arranged between two adjacent branch input electrodes from among the plurality of branch input electrodes.

In an example embodiment, the semiconductor layer may be connected to the plurality of branch input electrodes through a plurality of first contact holes, the semiconductor layer may be connected to the plurality of branch output electrodes through a plurality of second contact holes, and the first contact holes and the second contact holes may not overlap with the valley area in a plan view.

In an example embodiment, the buffer transistor may further include a bridge electrode to electrically connect the plurality of branch output electrodes to each other.

In an example embodiment, the bridge electrode may be connected to the plurality of branch output electrodes through a third contact hole, and the third contact hole and the bridge electrode may overlap with the semiconductor layer in a plan view.

In an example embodiment, the third contact hole may not overlap with the valley area in a plan view.

In an example embodiment, the pixel circuit may include a first pixel transistor, the first pixel transistor including: a first semiconductor pattern on a same layer as that of the semiconductor layer; a first gate electrode on the first semiconductor pattern; a first source electrode connected to a first area of the first semiconductor pattern; and a first drain electrode connected to a second area of the first semiconductor pattern.

In an example embodiment, the semiconductor layer and the first semiconductor pattern may include a polysilicon.

In an example embodiment, the pixel circuit may further include a second pixel transistor, the second pixel transistor including: a second semiconductor pattern; a second gate electrode on the second semiconductor pattern; a second source electrode connected to a first area of the second semiconductor pattern; and a second drain electrode connected to a second area of the second semiconductor pattern.

In an example embodiment, the second semiconductor pattern may include an oxide semiconductor, and the bridge electrode may be arranged on a same layer as that of the second gate electrode.

In an example embodiment, the display device may further include: an encapsulation layer to cover the display element layer; and an input sensing unit directly disposed on the encapsulation layer.

According to one or more example embodiments of the present disclosure, a display device includes: a base substrate including an active area and a non-active area adjacent to the active area; a display circuit layer including a pixel circuit at the active area of the base substrate, and a driving circuit at the non-active area of the base substrate, the driving circuit being configured to supply a driving signal to the pixel circuit; and a display element layer on the display circuit layer, and including light emitting elements. The driving circuit includes a buffer transistor configured to output the driving signal, the buffer transistor including: a semiconductor layer on the base substrate; a control electrode on the semiconductor layer; a first electrode connected to a plurality of first contact holes at a first area of the semiconductor layer; and a second electrode connected to a plurality of second contact holes at a second area of the semiconductor layer. The first contact holes and the second contact holes have an asymmetric structure on the basis of the control electrode.

In an example embodiment, a number of the first contact holes arranged at one side on the basis of the control electrode may be different from a number of the second contact holes arranged at another side on the basis of the control electrode.

In an example embodiment, the buffer transistor may include first and second buffer transistors, and a second electrode of the first buffer transistor may be connected to a first electrode of the second buffer transistor through a bridge electrode.

In an example embodiment, the bridge electrode may be connected to the second electrode of the first buffer transistor through a third contact hole, and the third contact hole may overlap with the semiconductor layer in a plan view.

BRIEF 15

The above and other aspects and features of the present disclosure will become more apparent to those skilled in the art from the following detailed description of the example embodiments with reference to the accompanying drawings. In the drawings.

DETAILED DESCRIPTION

Figure 1A:
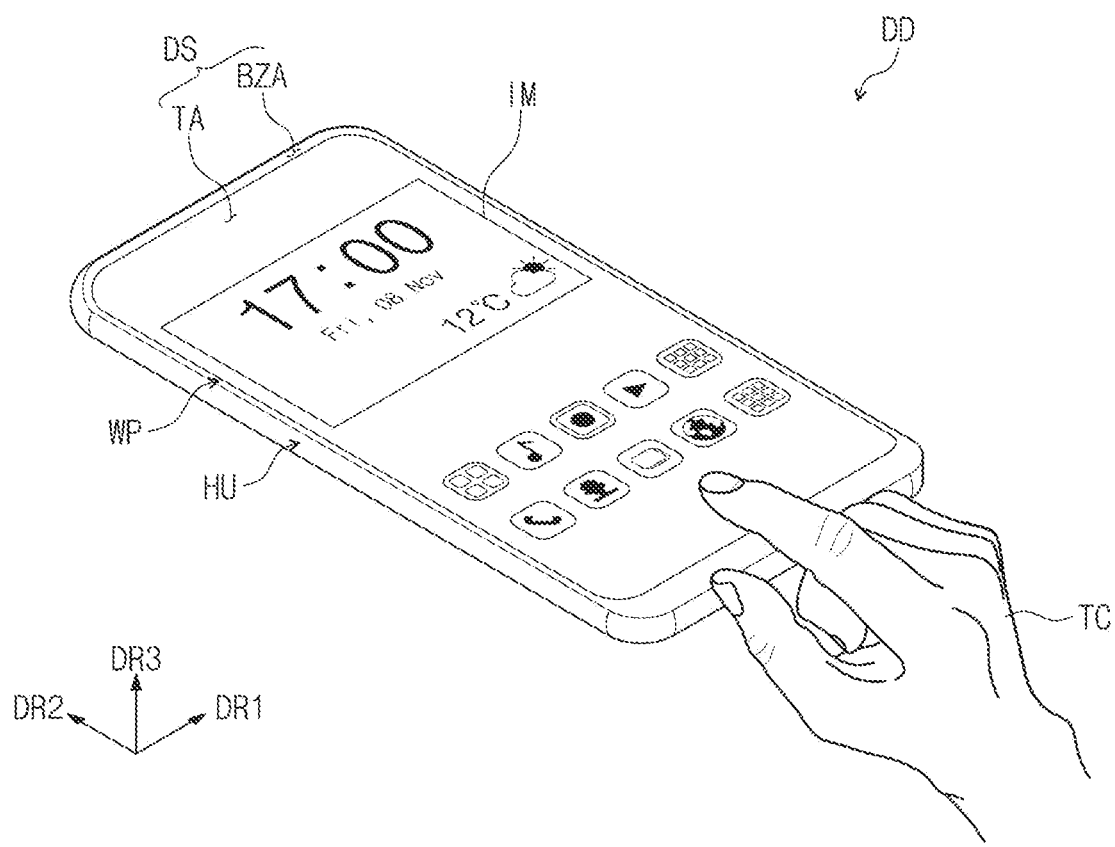
FIG. 1A is a perspective view of a display device according to an embodiment of the present disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. In addition, in the drawings, the thicknesses, the ratios, and/or the dimensions of the elements, layers, and regions may be exaggerated for effective illustration of the technical features thereof. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
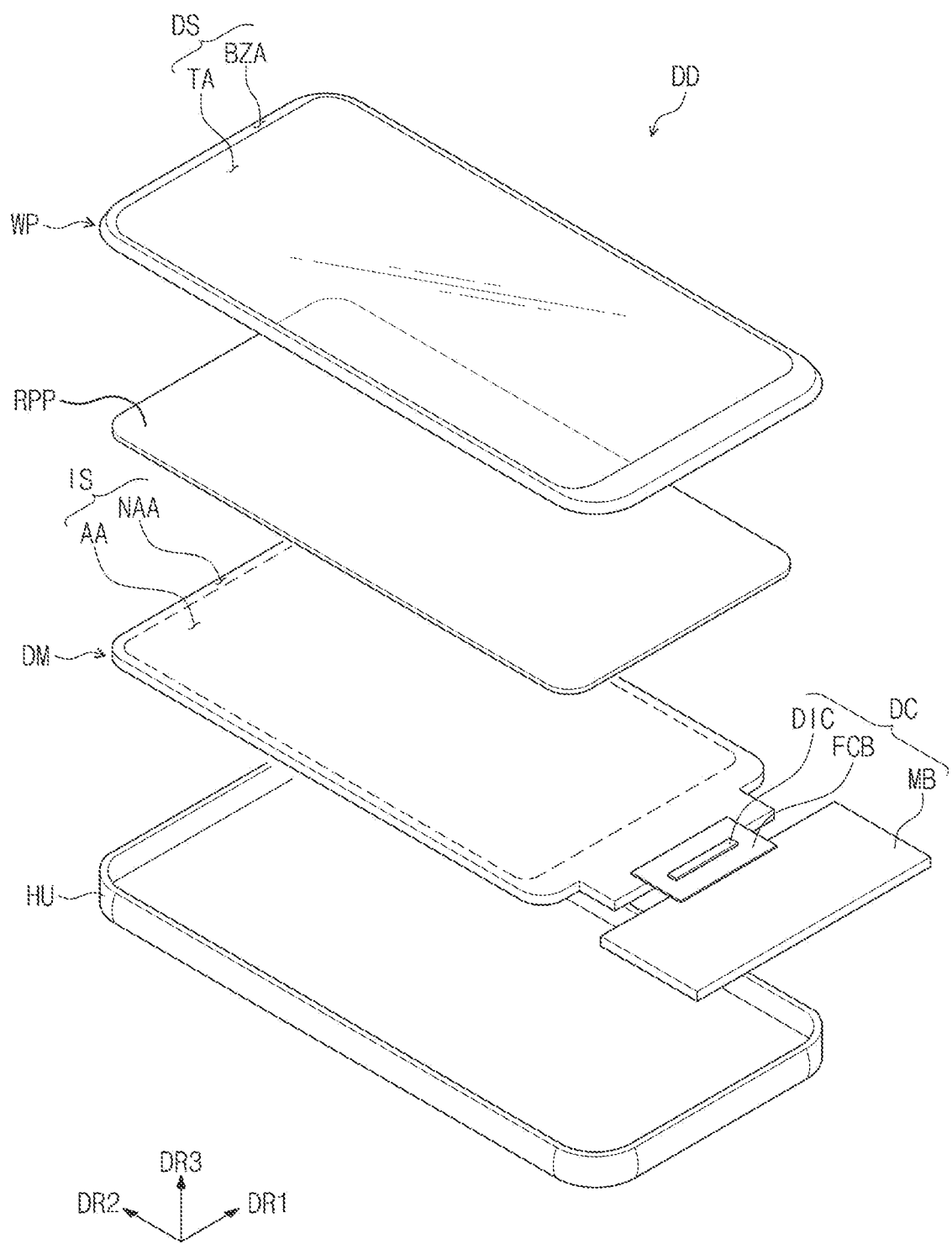
FIG. 1B is an exploded perspective view of a display device according to an embodiment of the present disclosure.
Figure 2:
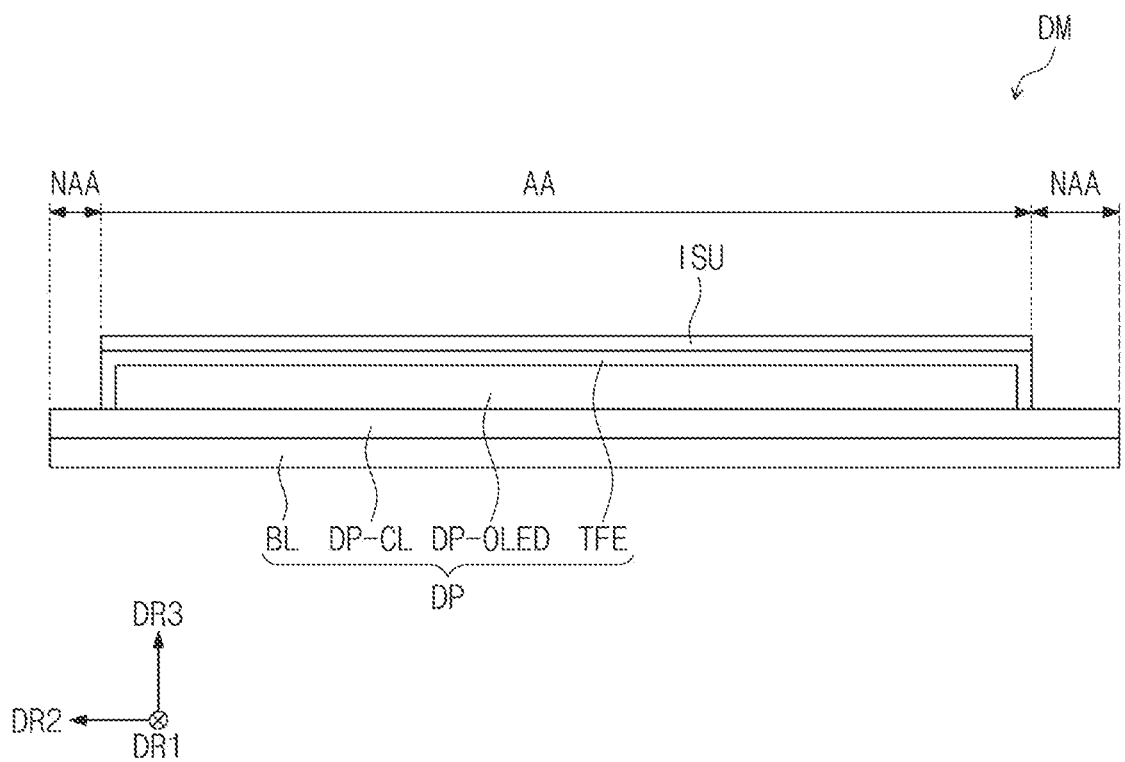
FIG. 2 is a simplified cross-sectional view illustrating the display module shown in FIG. 1B.

FIG. 1A is a perspective view of a display device DD according to an embodiment of the present disclosure. FIG. 1B is an exploded perspective view of a display device DD according to an embodiment of the present disclosure. FIG. 2 is a simplified cross-sectional view illustrating the display module DM shown in FIG. 1B.

Referring to FIGS. 1A and 1B, the display device DD may be a device that is activated according to an electrical signal. The display device DD according to various embodiments may be implemented as or included in a large-scale electronic device, for example, such as a television, a monitor, an outdoor billboard, and/or the like, and/or may be implemented as or included in a small and/or medium-sized electronic device, for example, such as a personal computer, a notebook computer, a personal digital assistant, a vehicle navigation unit (e.g., a vehicle navigation device), a game player, mobile electronic equipment, a camera, and/or the like. However, the present disclosure is not limited to the above-described examples, and the display device DD may be implemented as or included in any other suitable electronic devices without departing from the spirit and scope of the present disclosure. For convenience, the display device DD is exemplarily illustrated as a smartphone, but the present disclosure is not limited thereto.

The display device DD may display an image IM at (e.g., in or on) a display surface DS, which may be parallel to or substantially parallel to a first direction DR1 and a second direction DR2 to face towards a third direction DR3. The image IM may include a still image and/or a moving image. In FIG. 1A, an example of the image IM is illustrated as a clock window and various application icons, but the present disclosure is not limited thereto. The display surface DS at (e.g., in or on) which the image IM is displayed may correspond to a front surface of the display device DD, and may correspond to an entire surface of a window WP.

According to one or more example embodiments, a front surface (e.g., an upper surface) of each member and a rear surface (e.g., a lower surface) of each member may be defined based on the direction in which the image IM is displayed. For example, the front surface and the rear surface may face away from each other in the third direction DR3, and respective normal directions of the front surface and the rear surface may be parallel to or substantially parallel to the third direction DR3. However, the directions indicated by the first to third directions DR1, DR2, and DR3 are merely relative concepts, and may be changed to other suitable directions. As used in the present specification, the expression "when viewed in a plan view" may refer to a view "when viewed from the third direction DR3".

The display device DD according to some embodiments of the present disclosure may sense a user input TC that is applied externally. For example, in some embodiments, the display device DD may sense the user input TC applied to the front surface thereof. The user input TC may include various suitable kinds of external inputs, for example, such as a touch from a part of the user's body, light, heat, pressure, and/or the like. In some embodiments, the display device DD may further sense a user input TC applied to the side surface and/or the rear surface of the display device DD according to a structure of the display device DD, but the present disclosure is not limited thereto.

The display device DD may include the window WP, an anti-reflection panel RPP, a display module (e.g., a display layer or a display circuit) DM, and a housing HU. In some embodiments, the window WP and the housing HU may be combined to form an appearance (e.g., to form an external housing) of the display device DD.

The window WP may include an insulation material that is optically transparent. For example, the window WP may include glass and/or plastic. The window WP may have a multilayered structure or a single layer structure. For example, the window WP may include a plurality of plastic films bonded to one another with an adhesive, or a glass substrate and a plastic film bonded to each other with an adhesive. Hereinafter, "film" may also be understood as "layer".

As described above, the front surface of the window WP may define the display surface DS of the display device DD. The display surface DS may include a transmission area TA and a bezel area BZA. The transmission area TA may be an optically transparent area. For example, the transmission area TA may be an area in which optical transmittance thereof is about 90% or more.

The bezel area BZA may have a relatively low optical transmittance in comparison to the transmission area TA. The bezel area BZA may define a shape of the transmission area TA. For example, the bezel area BZA may be adjacent to the transmission area TA, and may surround (e.g., around a periphery of) the transmission area TA.

The bezel area BZA may have a suitable color (e.g., a predetermined or a prescribed color). For example, the bezel area BZA may cover a non-active area NAA of the display module DM to prevent or substantially prevent (e.g., to block) the non-active area NAA from being visibly recognized from the outside. However, the present disclosure is not limited thereto, and according to some embodiments, the bezel area BZA may be omitted from the window WP.

The anti-reflection panel RPP may be disposed under (e.g., underneath) the window WP. The anti-reflection panel RPP may reduce a reflection ratio of external light input from an upper side of the window WP. In some embodiments of the present disclosure, the anti-reflection panel RPP may be omitted, or may be included in (e.g., may be included as a part of) the display module DM.

The display module DM may display the image IM, and may sense the user input TC. The display module DM includes a front surface IS including an active area AA and the non-active area NAA. The active area AA may be an area that is activated according to an electrical signal.

According to some embodiments, the active area AA may be an area at (e.g., in or on) which the image IM is displayed, and an area at (e.g., in or on) which the user input TC is sensed. The transmission area TA may overlap with at least the active area AA. For example, the transmission area TA may overlap with an entire surface of the active area AA, or may overlap with at least a part (e.g., a portion) of the active area AA. Accordingly, a user may visibly recognize the image IM via the transmission area TA, and/or may provide the user input TC via the transmission area TA. However, the present disclosure is not limited thereto, and in other embodiments, the active area AA may be divided into an area at (e.g., in or on) which the image IM is displayed, and an area at (e.g., in or on) which the user input TC is sensed.

The non-active area NAA may be covered by the bezel area BZA. The non-active area NAA is adjacent to the active area AA. For example, the non-active area NAA may surround (e.g., around a periphery of) the active area AA. A driving circuit and/or driving lines for driving the active area AA and/or the like may be disposed at (e.g., in or on) the non-active area NAA.

A driving circuit unit (e.g., a driving circuit part) DC is electrically connected to the display module DM. The driving circuit unit DC may include a main circuit board MB and a flexible circuit board FCB.

The main circuit board MB may include various kinds of driving circuits for driving the display module DM, a connector for supplying power, and/or the like. The flexible circuit board FCB may be connected to the main circuit board MB and the display module DM. The driving circuit unit DC may further include a driving chip DIC mounted on the flexible circuit board FCB. However, the present disclosure is not limited thereto, and in some embodiments, the driving chip DIC may be directly mounted on the display module DM.

The housing HU is attached to (e.g., is combined with) the window WP. The housing HU is attached to the window WP to provide an internal space (e.g., a predetermined or a prescribed internal space). The display module DM may be accommodated in the internal space. The housing HU may include a material having relatively high hardness. For example, the housing HU may include a plurality of frames and/or plates including, for example, glass, plastic, metal, or a combination thereof. The housing HU may protect or substantially protect (e.g., may stably protect) components of the display device DD that are accommodated in the internal space from an external shock.

In some embodiments, a battery module (e.g., a battery or a battery pack) and/or the like for supplying power used for the operation (e.g., the overall operation) of the display device DD may be further disposed between the display module DM and the housing HU.

Referring to FIGS. 1B and 2, the display module DM according to some embodiments may include the display panel DP and an input sensing unit (e.g., an input sensing layer or an input sensing panel) ISU.

The display panel DP may display an image according to an electrical signal. The input sensing unit ISU may sense the user input TC (e.g., shown in FIG. 1A) that is applied externally. The user input TC may include various suitable kinds of inputs provided from outside the display device DD. For example, the user input TC may include an input applied (e.g., an input hovering) closely to the display device DD, an input applied adjacently to the display device DD at a suitable distance (e.g., a predetermined or prescribed distance), and/or an input applied as a contact (e.g., a touch) with a part of the body of the user, for example, such as the hand of the user. In various embodiments, the user input may include various suitable kinds of inputs, for example, such as force, pressure, temperature, light, and/or the like.

Referring to FIG. 2, the display panel DP may include a base layer BL, a display circuit layer DP-CL, a display element layer DP-OLED, and an encapsulation layer TFE.

The base layer BL may include a synthetic resin film. For example, in some embodiments, a synthetic resin layer may be formed on a working substrate used for manufacturing the display panel DP, and a conduction layer and an insulation layer may be formed on the synthetic resin layer. In this case, when the working substrate is removed, the synthetic resin layer of the resultant structure may correspond to the base layer BL. The base layer BL may be a polyimide-based resin layer, but the base layer BL of the present disclosure is not limited to any particular material. The base layer BL may include a glass substrate, a metal substrate, an organic/inorganic composite material substrate, and/or the like.

The display circuit layer DP-CL is disposed on the base layer BL. The display circuit layer DP-CL may include at least one insulation layer, and a circuit element. Hereinafter, the insulation layer included in the display circuit layer DP-CL may be referred to as an intermediate insulation layer. The intermediate insulation layer includes at least one intermediate inorganic film, and at least one intermediate organic film. The circuit element includes a signal line, a pixel driving circuit, and/or the like. The display circuit layer DP-CL may be formed through a process for forming an insulation layer, a semiconductor layer, and a conduction layer by coating, deposition, and/or the like, a photolithography process for the insulation layer and the semiconductor layer, and a patterning process for the conductive layer.

The display element layer DP-OLED may include an organic light emitting element, and a pixel definition layer. The display element layer DP-OLED will be described in more detail below with reference to FIG. 5.

The encapsulation layer TFE encapsulates the display element layer DP-OLED. The encapsulation layer TFE may include at least one inorganic layer, and at least one organic layer. The inorganic layer may protect or substantially protect the display element layer DP-OLED from moisture/oxygen. The inorganic layer may include a silicon nitride layer, a silicon oxy-nitride layer, a silicon oxide layer, a titanium oxide layer, an aluminum oxide layer, and/or the like, but the present disclosure is not limited thereto.

The input sensing unit ISU may be directly disposed on the display panel DP. For example, in some embodiments, the input sensing unit ISU may be directly disposed on the encapsulation layer TFE. As used in this specification, the phrase "directly disposed" refers to forming by a continuous or substantially continuous process, and excludes attaching by using a separate adhesive layer.

The input sensing unit ISU may include sensing electrodes and sensing lines. The sensing electrodes and the sensing lines may have a single layer structure or a multi-layered structure.

Figure 3A:
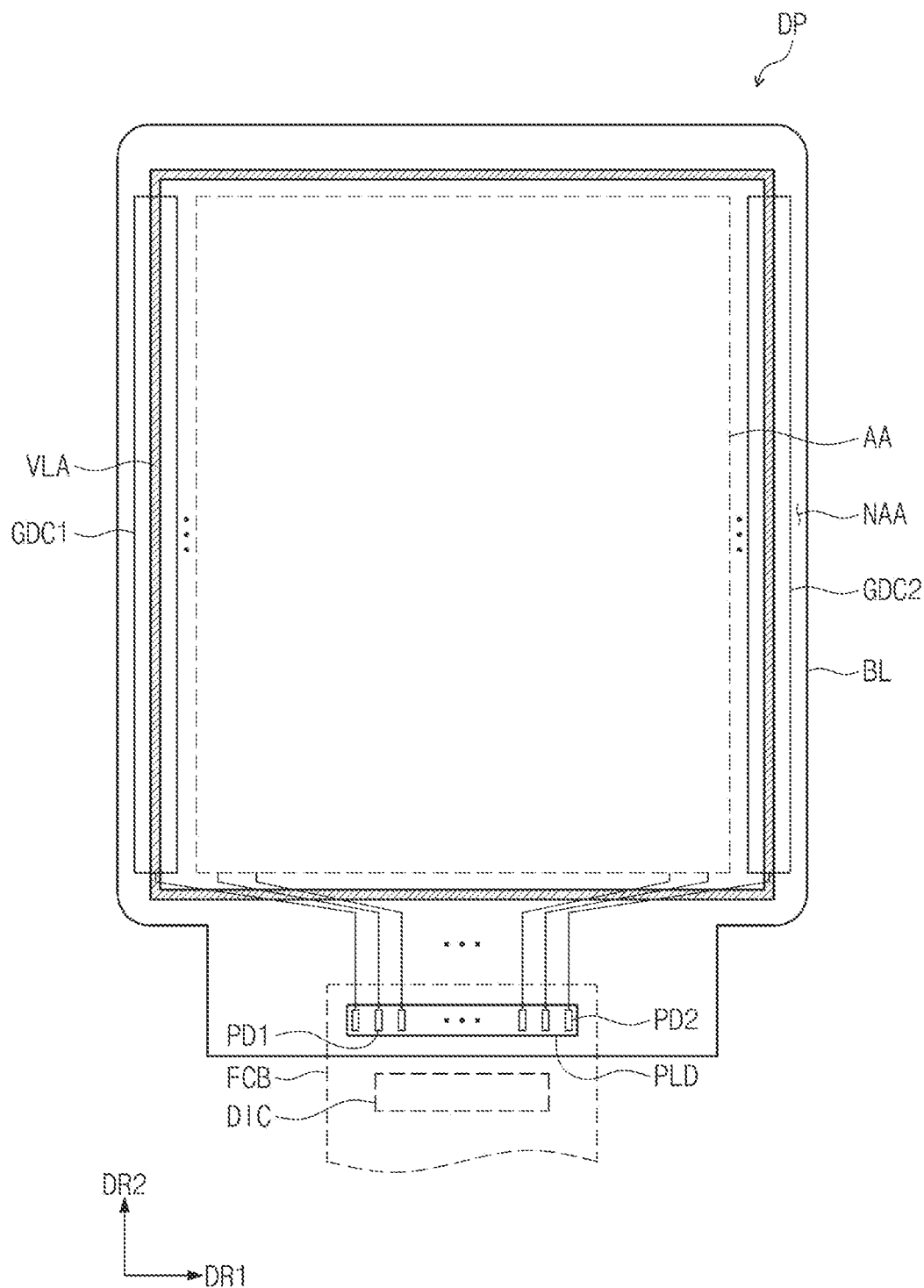
FIG. 3A is a plan view of a display panel according to an embodiment of the present disclosure.
Figure 3B:
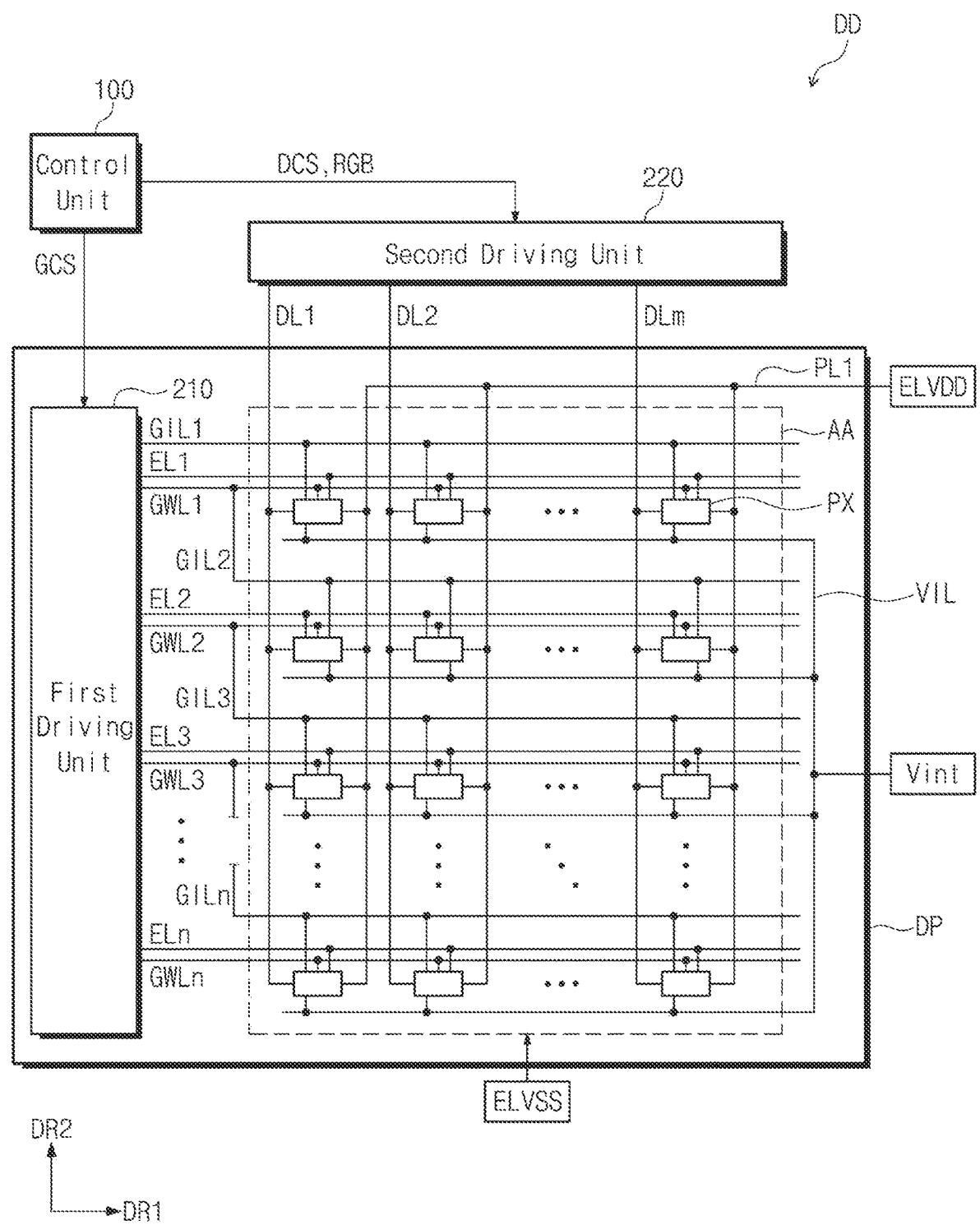
FIG. 3B is a block diagram of a display device according to an embodiment of the present disclosure.

FIG. 3A is a plan view of a display panel DP according to an embodiment of the present disclosure. FIG. 3B is a block diagram of a display device DD according to an embodiment of the present disclosure.

Referring to FIGS. 3A and 3B, the display panel DP includes an active area AA at (e.g., in or on) which an image is displayed, and a non-active area NAA surrounding (e.g., around a periphery of) the active area AA. A plurality of pixels PX may be provided at (e.g., in or on) the active area AA. A first driving unit (e.g., a first driver) 210 for driving the plurality of pixels PX may be provided at (e.g., in or on) the non-active area NAA. The first driving unit 210 may exemplarily include a first gate driving unit (e.g., a first gate driver) GDC1 disposed at (e.g., in or on) one side of the active area AA in parallel to or substantially in parallel to the second direction DR2, and a second gate driving unit (e.g., a second gate driver) GDC2 disposed at (e.g., in or on) another side of the active area AA to be side by side with the first gate driving unit GDC1. For example, the second gate driving unit GDC2 may be disposed at an opposite side of the active area AA from that of the first gate driving unit GDC1 in the first direction DR1, such that the active area AA is between the first gate driving unit GDC1 and the second gate driving unit GDC2. FIG. 3A exemplarily illustrates a structure in which the first driving unit 210 includes the first and second gate driving units GDC1 and GDC2, but the present disclosure is not limited thereto. For example, in some embodiments, the first driving unit 210 may include one gate driving unit (e.g., one gate driver) provided at (e.g., in or on) one side (e.g., a left side or a right side) of the active area AA.

The first and second gate driving units GDC1 and GDC2 may be directly formed on the base layer BL through a thin film process. For example, the first and second gate driving units GDC1 and GDC2 may be concurrently formed (e.g., simultaneously formed or substantially simultaneously formed) at (e.g., in or on) the non-active area NAA in a thin film process for forming the pixels PX at (e.g., in or on) the active area AA.

A pad unit (e.g., a pad circuit) PLD may be provided at (e.g., in or on) the non-active area NAA of the display panel DP. The pad unit PLD may include first pads PD1 connected to the pixels PX at (e.g., in or on) the active area AA, and second pads PD2 connected to the first and second gate driving units GDC1 and GDC2 at (e.g., in or on) the non-active area NAA. The pad unit PLD may be a part to which the flexible circuit board FCB is connected. The flexible circuit board FCB may be attached (e.g., may be combined) to the display panel DP, and thus, the first and second pads PD1 and PD2 may be electrically connected to the driving chip DIC mounted on the flexible circuit board FCB.

A valley area VLA, which may be formed by removing the insulation layer along a perimeter of the active area AA, is provided at (e.g., in or on) the non-active area NAA. In this case, the insulation layer may include the intermediate insulation layer included in the display circuit layer DP-CL, and/or the pixel definition layer included in the display element layer DP-OLED. In other words, the valley area VLA may surround (e.g., around a periphery of) the active area AA. In an embodiment of the present disclosure, the valley area VLA may be provided in a closed loop shape. However, the present disclosure is not limited thereto, and in some embodiments, instead of the closed loop shape, the valley area VLA may include an open part at one area (e.g., at one side) thereof as necessary or desired.

In some embodiments, each of the first and second gate driving units GDC1 and GDC2 may overlap with the valley area VLA. On the other hand, when the first driving unit 210 includes one gate driving unit (e.g., includes only one gate driver), the valley area VLA may overlap with the one gate driving unit.

Referring to FIG. 3B, the display device DD includes the display panel DP, the first driving unit 210, a second driving unit (e.g., a second driver) 220, and a control unit (e.g., a controller or a timing controller) 100.

The control unit 100 controls driving of the first driving unit 210 and the second driving unit 220. The control unit 100 may convert a data format of input image signals according to a specification of an interface with the second driving unit 220, and may generate image data RGB. The control unit 100 may output the image data RGB and various kinds of control signals DCS and GCS.

The first driving unit 210 receives a first control signal GCS from the control unit 100. In FIG. 3B, a structure in which the first driving unit 210 includes one gate driving unit is exemplarily illustrated. However, the present disclosure is not limited thereto, and in some embodiments, the first driving unit 210 may include the first and second gate driving units GDC1 and GDC2 as described above. The first control signal GCS may include a vertical start signal for starting an operation of the first driving unit 210, a clock signal for determining an output time of signals, and/or the like. The first driving unit 210 may generate a plurality of gate signals, and may output (e.g., may sequentially output) the plurality of gate signals to a plurality of gate lines GIL1 to GILn and GWL1 to GWLn, which will be described in more detail further below. In some embodiments, the first driving unit 210 may further generate a plurality of emission control signals in response to the first control signal GCS, and may output the plurality of emission control signals to a plurality of emission control lines EL1 to ELn, which will be described in more detail further below.

The second driving unit 220 receives a second control signal DCS and the image data RGB from the control unit 100. The second driving unit 220 may convert the image data RGB to data signals, and may output the data signals to a plurality of data lines DL1 to DLm, which will be described in more detail further below. In some embodiments, the data signals may have analog voltages corresponding to gradation values of the image data RGB.

The display panel DP includes the plurality of gate lines GIL1 to GILn and GWL1 to GWLn, the plurality of emission control lines EL1 to ELn, the plurality of data lines DL1 to DLm, and the plurality of pixels PX. The plurality of gate lines GIL1 to GILn and GWL1 to GWLn may extend in the first direction DR1, and may be arranged along the second direction DR2, which may cross (e.g., which may be orthogonal to) the first direction DR1. Each of the emission control lines EL1 to ELn may be arranged side by side with corresponding gate lines from among the plurality of gate lines GIL1 to GILn and GWL1 to GWLn. The plurality of data lines DL1 to DLm may be insulated from, and may cross with, the plurality of gate lines GIL1 to GILn and GWL1 to GWLn.

Each of the plurality of pixels PX is connected to corresponding gate lines from among the plurality of gate lines GIL1 to GILn and GWL1 to GWLn, a corresponding emission control line from among the plurality of emission control lines EL1 to ELn, and a corresponding data line from among the plurality of data lines DL1 to DLm. While FIG. 3B illustrates an example in which each of the plurality of pixels PX is connected to two gate lines from among the plurality of gate lines GIL1 to GILn and GWL1 to GWLn, the present disclosure is not limited thereto. For example, in other embodiments, each pixel PX may be connected to three gate lines from among the plurality of gate lines GIL1 to GILn and GWL1 to GWLn.

The display panel DP receives a first driving voltage ELVDD and a second driving voltage ELVSS. The first driving voltage ELVDD may be provided to the plurality of pixels PX through a first power line PL1. The second driving voltage ELVSS may be provided to the plurality of pixels PX through electrodes and/or a second power line (not shown) provided at (e.g., in or on) the display panel DP.

The display panel DP receives an initialization voltage Vint. The initialization voltage Vint may be provided to the plurality of pixels PX through an initialization voltage line VIL.

Figure 4A:
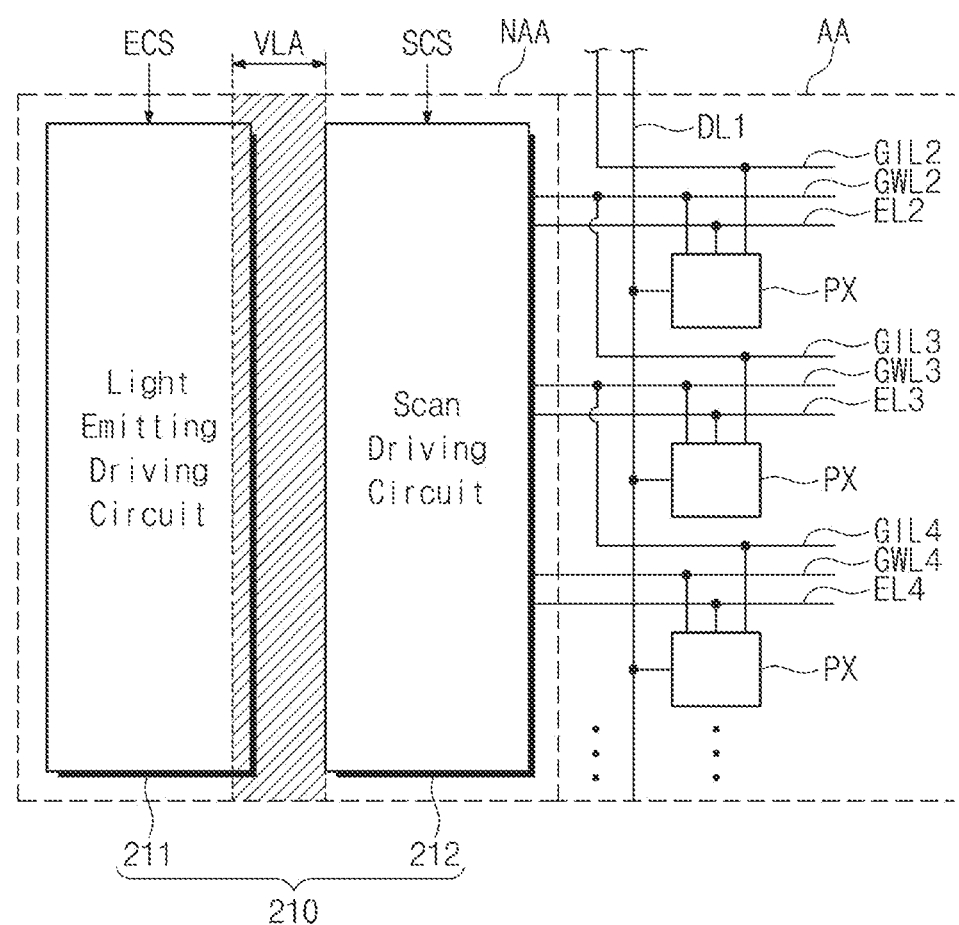
FIG. 4A is an internal block diagram of the first driving unit illustrated in FIG. 3B.
Figure 4B:
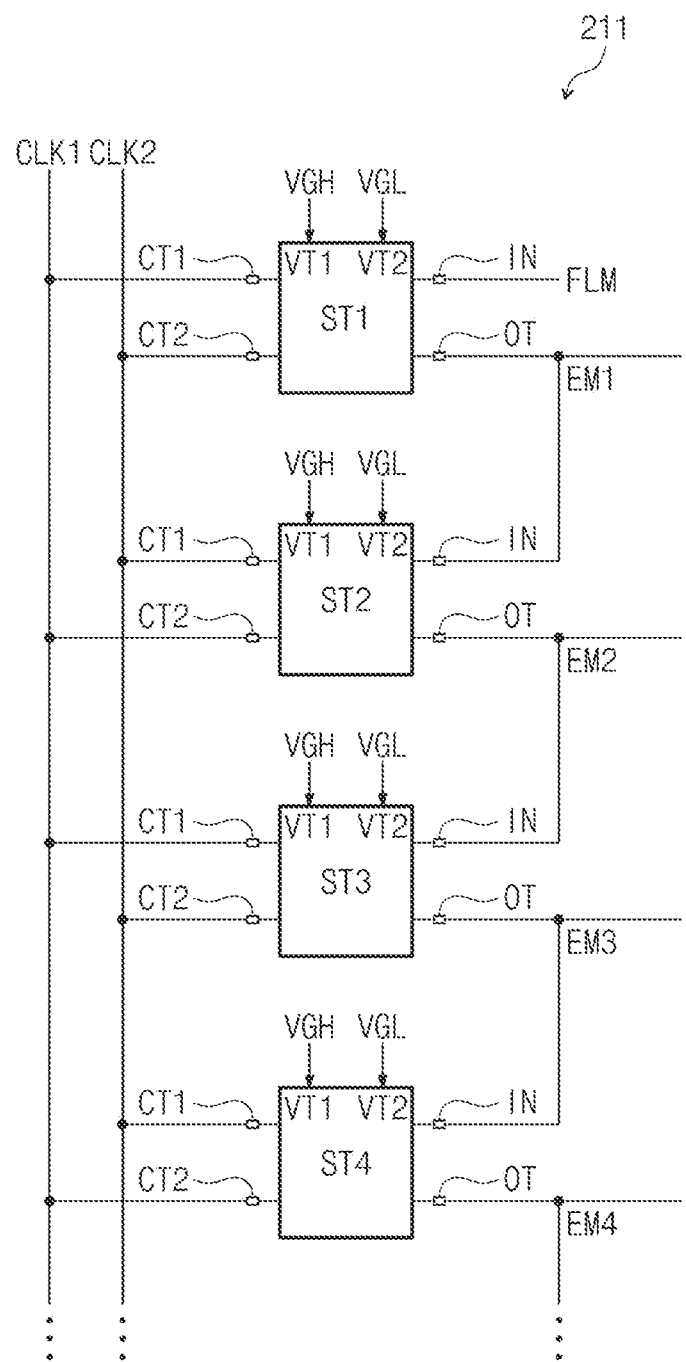
FIG. 4B is an internal block diagram of the light emission driving circuit illustrated in FIG. 4A.
Figure 4C:
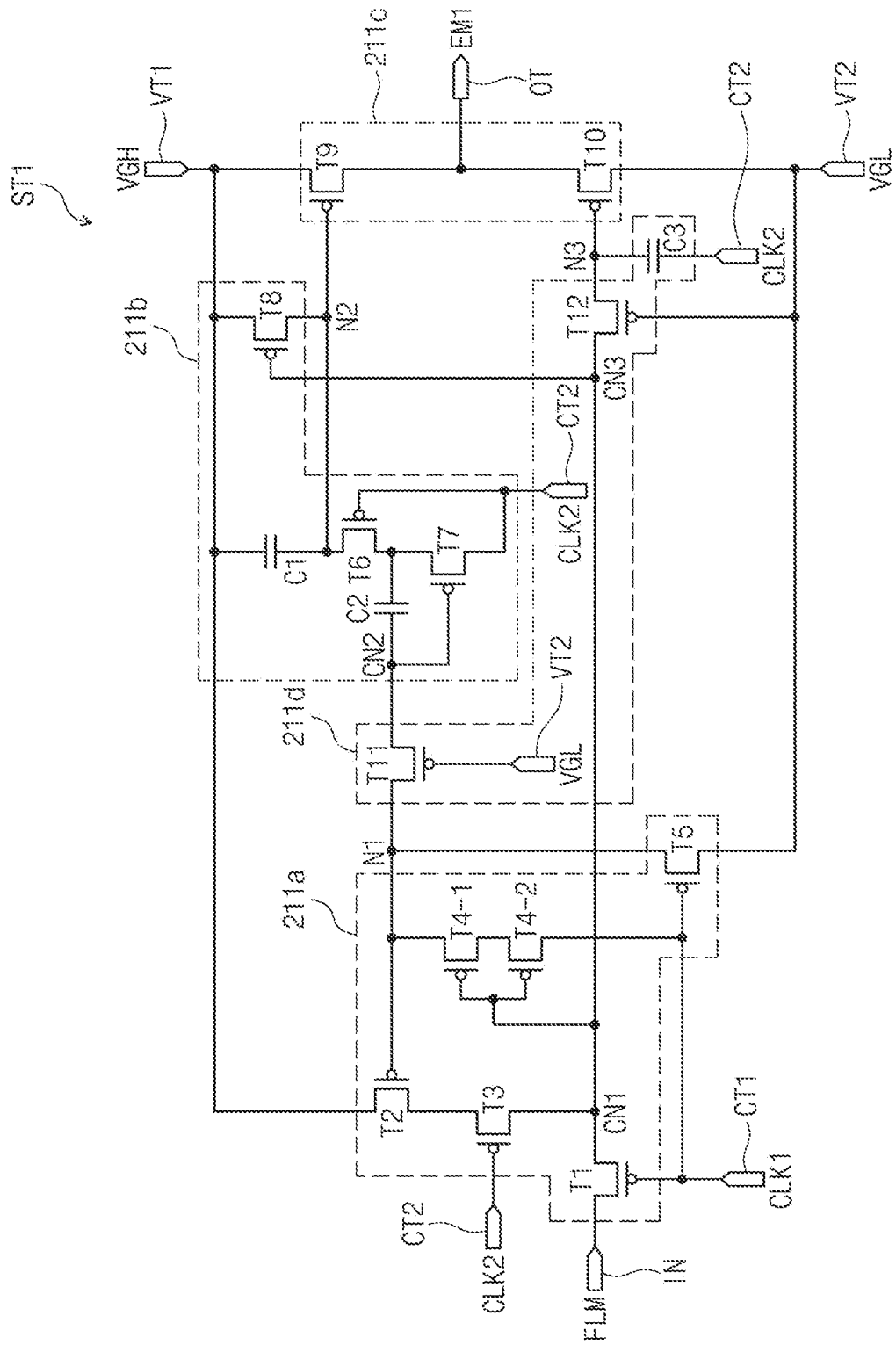
FIG. 4C is an internal circuit diagram of the first stage illustrated in FIG. 4B.

FIG. 4A is an internal block diagram of the first driving unit 210 illustrated in FIG. 3B, FIG. 4B is an internal block diagram of the light emission driving circuit 211 illustrated in FIG. 4A, and FIG. 4C is an internal circuit diagram of the first stage ST1 illustrated in FIG. 4B.

Referring to FIGS. 3B and 4A, the first driving unit 210 may include a light emission driving circuit 211 and a scan driving circuit 212 disposed at (e.g., in or on) the non-active area NAA. In some embodiments, as illustrated in FIG. 3A, when the first driving unit 210 includes the first and second gate driving units GDC1 and GDC2, each of the first and second gate driving units GDC1 and GDC2 may include the light emission driving circuit 211 and the scan driving circuit 212. However, the present disclosure is not limited thereto, and in other embodiments, when the first driving unit 210 includes the first and second gate driving units GDC1 and GDC2, the light emission driving circuit 211 may only be included in any suitable one of the first and second gate driving units GDC1 and GDC2.

The light emission driving circuit 211 may receive a first driving control signal ECS from among (e.g., included in) the first control signals GCS, and the scan driving circuit 212 may receive a second driving control signal SCS from among (e.g., included in) the first control signals GCS. The first driving control signal ECS may include an emission control start signal, and first and second clock signals. The second driving control signal SCS may include a scan start signal, and third and fourth clock signals. As another example, in some embodiments, the light emission control circuit 211 and the scan driving circuit 212 may share some of the control signals. For example, the first and second clock signals provided to the light emission driving circuit 211 may also be provided to the scan driving circuit 212, instead of the third and fourth clock signals. In this case, because the light emission driving circuit 211 and the scan driving circuit 212 may share the clock signals, a number of clock lines used for driving the first driving unit 210 may be reduced.

The light emission driving circuit 211 may be connected to the emission control lines EL1 to ELn disposed at (e.g., in or on) the active area AA, and may output (e.g., may sequentially output) the emission control signals to the emission control lines EL1 to ELn. The scan driving circuit 212 may be connected to the gate lines GIL1 to GILn and GWL1 to GWLn disposed at (e.g., in or on) the active area AA, and may output (e.g., may sequentially output) the gate signals to the gate lines GIL1 to GILn and GWL1 to GWLn.

The valley area VLA may be provided between the light emission driving circuit 211 and the scan driving circuit 212. For example, in some embodiments, the valley area VLA may overlap with a part of the light emission driving circuit 211.

Referring to FIG. 4B, the light emission driving circuit 211 may include a plurality of stages ST1 to ST4 connected to each other. As illustrated in FIG. 3B, when n emission control lines EL1 to ELn are included in the display panel DP, where n is a natural number greater than 1, the light emission driving circuit 211 may include n stages connected to the n emission control lines, respectively. However, in FIG. 4B, for convenience of illustration, only 4 stages ST1 to ST4 are shown. The first to fourth stages ST1 to ST4 are connected to the first to fourth emission control lines EL1 to EL4, respectively, to output the first to fourth emission control signals EM1 to EM4. In some embodiments, the stages ST1 to ST4 may have the same or substantially the same circuit configuration as each other.

Each of the stages ST1 to ST4 may include an input terminal IN, a first control terminal CT1, a second control terminal CT2, and an output terminal OT. The input terminal IN may receive an output signal (e.g., a previous emission control signal) from a previous stage, or an emission control start signal FLM. For example, the input terminal IN of the first stage ST1 may receive the emission control start signal FLM, and the input terminal IN of the second stage ST2 may receive the first emission control signal EM1 output from the first stage ST1.

Each of the stages ST1 to ST4 may receive the first and second clock signals CLK1 and CLK2 through the first and second control terminals CT1 and CT2. For example, in some embodiments, the first control terminal CT1 of a j-th stage (where j is an odd number) from among the stages ST1 to ST4 may receive a first clock signal CLK1, and the second control terminal CT2 of the j-th stage may receive a second clock signal CLK2. In this case, in some embodiments, the first control terminal CT1 of a (j+1)-th stage may receive the second clock signal CLK2, and the second control terminal CT2 of the (j+1)-th stage may receive the first clock signal CLK1. The first clock signal CLK1 and the second clock signal CLK2 may have the same or substantially the same period as each other, and may have different phases from one another. For example, the second clock signal CLK2 may have an inverse phase to that of the first clock signal CLK1.

The stages ST1 to ST4 may further include first and second power terminals VT1 and VT2 to receive a first gate driving voltage VGH and a second gate driving voltage VGL, respectively. Each of the first and second gate driving voltages VGH and VGL may have a suitable direct-current (DC) voltage level.

In some embodiments, the first gate driving voltage VGH may have (e.g., may be set to) a gate-on voltage, and the second gate driving voltage VGL may have (e.g., may be set to) a gate-off voltage. For example, when the pixel PX and the light emission driving circuit 211 include PMOS transistors, the first gate driving voltage VGH may correspond to a logic low level and the second gate driving voltage VGL may correspond to a logic high level. However, the present disclosure is not limited thereto. For example, when the pixel PX and the light emission driving circuit 211 include NMOS transistors, the first gate driving voltage VGH may correspond to a logic high level and the second gate driving voltage VGL may correspond to a logic low level.

The stages ST1 to ST4 may output (e.g., may sequentially output) the emission control signals EM1 to EM4. For example, the output terminal OT of each of the stages ST1 to ST4 may be connected to a corresponding emission control line (e.g., EL1, EL2, EL3, or EL4) to output a corresponding emission control signal (e.g., EM1, EM2, EM3, or EM4) to the corresponding emission control line (e.g., EL1, EL2, EL3, or EL4).

Hereinafter, referring to FIG. 4C, a circuit configuration of the first stage ST1 from among the stages ST1 to ST4 will be described in more detail. Because each of the stages ST1 to ST4 may have the same or substantially the same circuit configuration as one another, redundant description of the circuit configuration of the other remaining stages ST2 to ST4 may not be repeated.

Referring to FIG. 4C, the first stage ST1 includes a first node control unit (e.g., a first node control circuit) 211a, a second node control unit (e.g., a second node control circuit) 211b, a buffer unit (e.g., a buffer circuit) 211c, and a third node control unit (e.g., a third node control circuit) 211d.

The first node control unit 211a controls the potential of a first node N1 on the basis of the emission control start signal FLM (or in the case of the other remaining stages ST2 to ST4, on the basis of the previous emission control signal output from a previous stage) received through the input terminal IN, and the first and second clock signals CLK1 and CLK2 received through the first and second control terminals CT1 and CT2.

The first node control unit 211a may include a first transistor T1, a second transistor T2, a third transistor T3, a pair of fourth transistors T4-1 and T4-2, and a fifth transistor T5. The first transistor T1 includes a first electrode connected to the input terminal IN, a control electrode connected to the first control terminal CT1, and a second electrode connected to a first combination node CN1. The second transistor T2 includes a control electrode connected to the first node N1, a first electrode connected to the first power terminal VT1, and a second electrode connected to the third transistor T3. The third transistor T3 includes a control electrode connected to the second control terminal CT2, a first electrode connected to the second electrode of the second transistor T2, and a second electrode connected to the first combination node CN1.

The pair of fourth transistors T4-1 and T4-2 are connected in series between the first node N1 and the first control terminal CT1. Control electrodes of the fourth transistors T4-1 and T4-2 are connected to the first combination node CN1. The fifth transistor T5 includes a control electrode connected to the first control terminal CT1, a first electrode connected to the first node N1, and a second electrode connected to the second power terminal VT2.

The first node control unit 211a controls the potential of the first node N1 on the basis of the first clock signal CLK1 (or on the basis of the second clock signal CLK2 depending on the stage) received at the first control terminal CT1. The first transistor T1 is turned on based on the first clock signal CLK1 (or based on the second clock signal CLK2 depending on the stage) to electrically connect the input terminal IN with the first combination node CN1. The fifth transistor T5 is turned on together with the first transistor T1 on the basis of the first clock signal CLK1 (or on the basis of the second clock signal CLK2 depending on the stage). The potential of the first node N1 is changed to the second gate driving voltage VGL by the turned-on fifth transistor T5. The second transistor T2 may be turned on or turned off according to the potential of the first node N1.

The third transistor T3 is turned on or turned off on the basis of the second clock signal CLK2 (or on the basis of the first clock signal CLK1 depending on the stage) received at the second control terminal CT2. When the second clock signal CLK2 has a phase difference from the first clock signal CLK1, a turn-on period of the third transistor T3 may be different from those of the first and fifth transistors T1 and T5. When the third transistor is turned on, the potential of the first combination node CN1 may be changed to the first gate driving voltage VGH. The pair of fourth transistors T4-1 and T4-2 may be turned on or turned off according to the potential of the first combination node CN1.

The second node control unit 211b includes first and second capacitors C1 and C2, and sixth to eighth transistors T6, T7, and T8.

The first capacitor C1 is disposed between the first power terminal VT1 and a second node N2. The sixth transistor T6 includes a control electrode connected to the second control terminal CT2, a first electrode connected to the second node N2, and a second electrode connected to the seventh transistor T7. The seventh transistor T7 includes a control electrode connected to a second combination node CN2, a first electrode connected to the sixth transistor T6, and a second electrode connected to the second control terminal CT2. The second capacitor C2 is disposed between the second combination node CN2 and the first electrode of the seventh transistor T7. The eighth transistor T8 includes a control electrode connected to a third combination node CN3, a first electrode connected to the first power terminal VT1, and a second electrode connected to the second node N2.

The second node control unit 211b may control the potential of the second node N2 on the basis of the second clock signal CLK2 (or on the basis of the first clock signal CLK1 depending on the stage) received at the second control terminal CT2.

The buffer unit 211c includes ninth and tenth transistors T9 and T10. Hereinafter, for convenience of explanation, the ninth and tenth transistors T9 and T10 may be referred to as first and second buffer transistors, respectively. The first buffer transistor T9 includes a control electrode connected to the second node N2, a first electrode connected to the first power terminal VT1, and a second electrode connected to the output terminal OT. The second buffer transistor T10 includes a control electrode connected to a third node N3, a first electrode connected to the output terminal OT, and a second electrode connected to the second power terminal VT2. The first buffer transistor T9 is turned on or turned off according to the potential of the second node N2 to output the emission control signal EM1 to the output terminal OT. In other words, when the first buffer transistor T9 is turned on, the first gate driving voltage VGH may be output to the output terminal OT.

The second buffer transistor T10 is turned on or turned off according to the potential of the third node N3 to output the emission control signal EM1 to the output terminal OT. For example, when the second buffer transistor T10 is turned on, the second gate driving voltage VGL may be output to the output terminal OT.

The third node control unit 211d includes a third capacitor C3, and eleventh and twelfth transistors T11 and T12. The third capacitor C3 is disposed between the third node N3 and the second control terminal CT2. The eleventh transistor T11 includes a control electrode connected to the second power terminal VT2, a first electrode connected to the first node N1, and a second electrode connected to the second combination node CN2. The twelfth transistor T12 includes a control electrode connected to the second power terminal VT2, a first electrode connected to the third combination node CN3, and a second electrode connected to the third node N3. The third node control unit 211d may control the potentials of the second combination node CN2 and the third node N3 on the basis of the second gate voltage VGL.

Figure 5A:
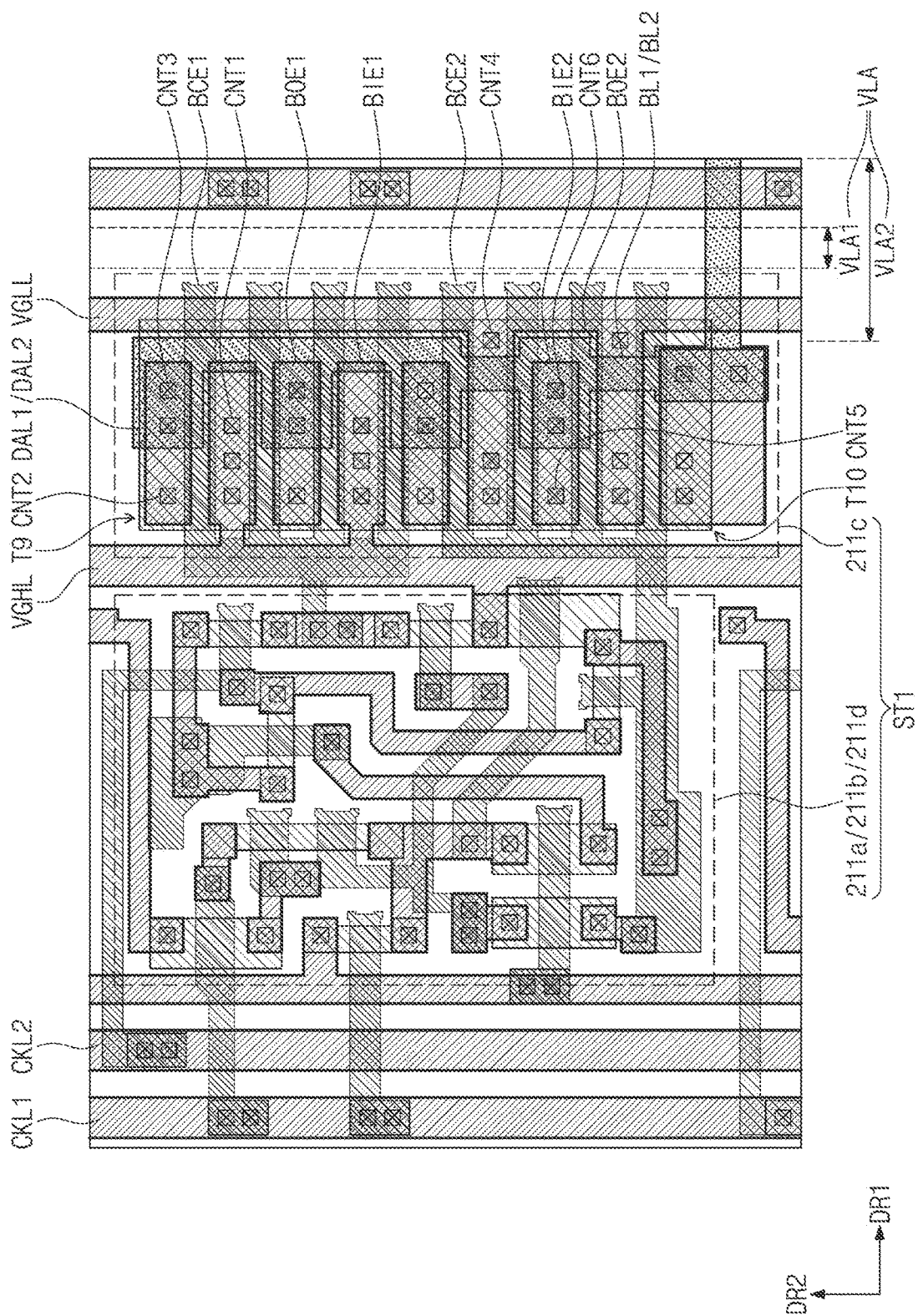
FIG. 5A is a plan view illustrating a layout of the first stage illustrated in FIG. 4C.
Figure 5B:
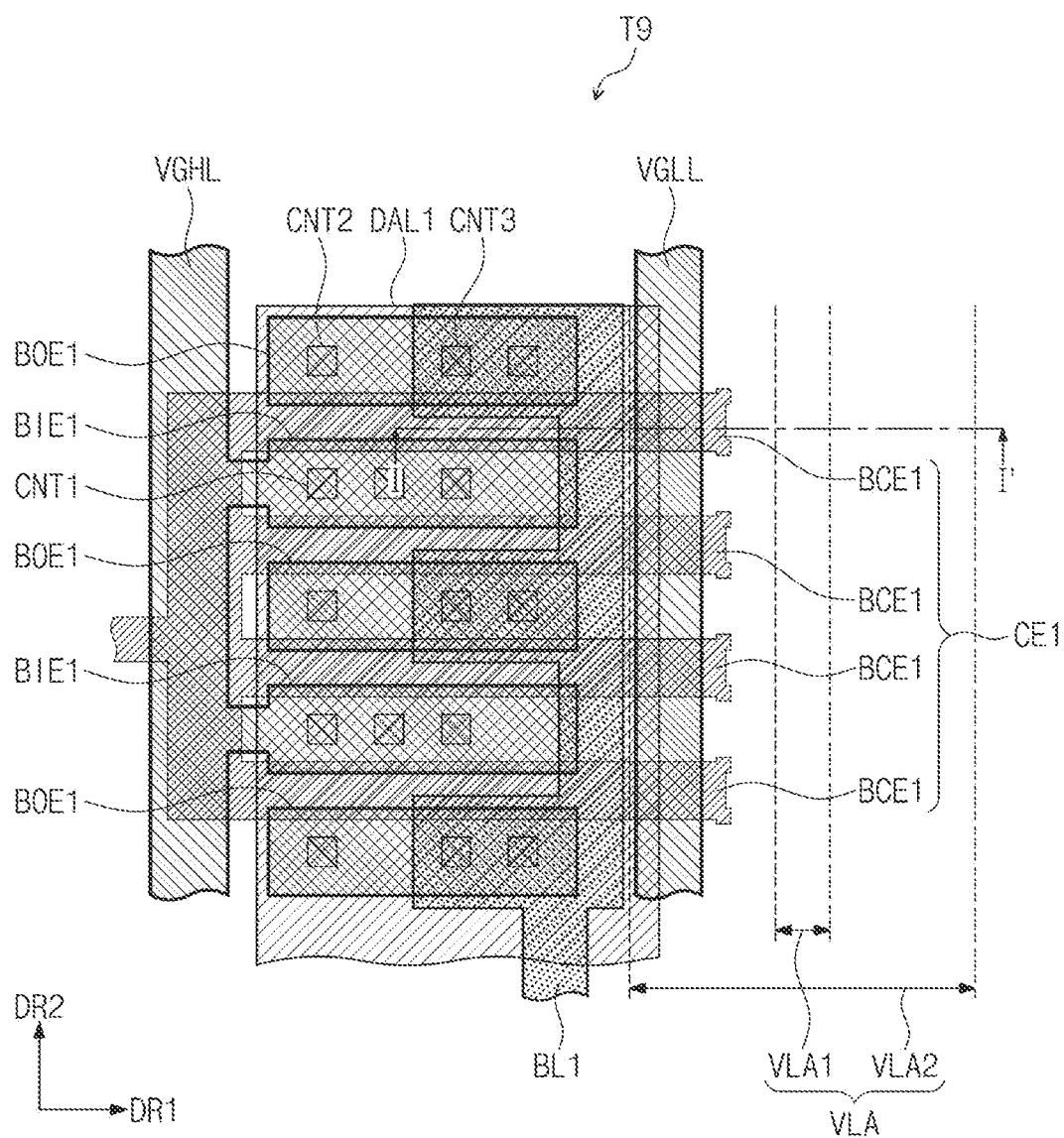
FIG. 5B is an enlarged view of the first buffer transistor illustrated in FIG. 5A.
Figure 6:
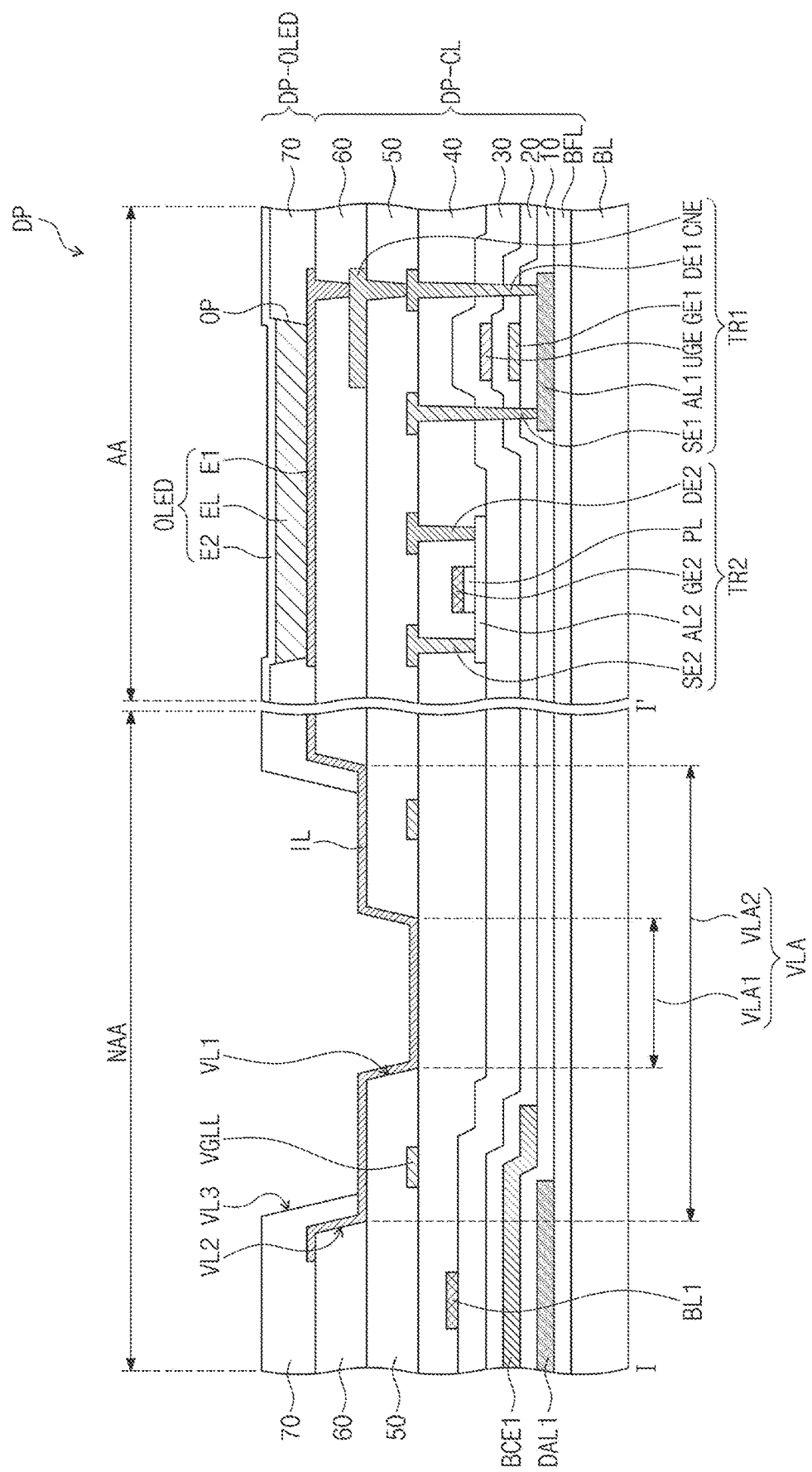
FIG. 6 is a cross-sectional view illustrating a cross-sectional structure of a buffer unit cut along the cutting line I-I' illustrated in FIG. 5B, and a cross-sectional structure of a pixel.

FIG. 5A is a plan view illustrating a layout of the first stage ST1 illustrated in FIG. 4C, and FIG. 5B is an enlarged view of the first buffer transistor T9 illustrated in FIG. 5A. FIG. 6 is a cross-sectional view illustrating a cross-sectional structure of a buffer unit 211c cut along the cutting line I-I' illustrated in FIG. 5B, and a cross-sectional structure of a pixel PX.

Referring to FIGS. 4A, 4C, 5A, and 5B, the first stage ST1 may be disposed at (e.g., in or on) the non-active area NAA of the display panel DP. First and second clock lines CKL1 and CKL2 may be disposed at (e.g., in or on) the left side of the first stage ST1, and a second gate driving voltage line VGLL may be disposed at (e.g., in or on) the right side of the first stage ST1. The buffer unit 211c may be disposed between a first gate driving voltage line VGHL and the second gate driving voltage line VGLL. The first to third node control units 211a, 211b and 211d may be disposed between the second clock line CKL2 and the first gate driving voltage line VGHL.

A valley area VLA, in which at least one organic insulation layer is opened to form a valley, may be disposed at (e.g., in or on) one side of the first stage ST1. At (e.g., in or on) the valley area VLA, a first valley formed from an opened first organic insulation layer and a second valley formed from an opened second organic insulation layer may be provided.

When the insulation layer is formed from an organic material, the insulation layer may have flexibility and elasticity, but moisture and/or oxygen may be permeated (e.g., may be easily permeated) therethrough in comparison to an insulation layer formed of an inorganic material. Accordingly, the valley area VLA, which may be obtained by removing the organic insulation layer from the display panel DP according to an embodiment of the present disclosure, may be provided at (e.g., in or on) the non-active area NAA. Accordingly, moisture and/or oxygen may be prevented or substantially prevented (e.g., may be blocked) by the valley area VLA from flowing into the active area AA from the outside.

The valley area VLA may exemplarily include a first valley area VLA1, at (e.g., in or on) which the first valley is formed, and a second valley area VLA2, at (e.g., in or on) which the second valley is formed. The first valley area VLA1 may be provided to have a smaller width (e.g., in the first direction DR1) than that of the second valley area VLA2.

The buffer unit 211c of the first stage ST1 may overlap with the second valley area VLA2. The buffer unit 211c of the first stage ST1 includes the first buffer transistor T9 and the second buffer transistor T10. The first buffer transistor T9 includes a first semiconductor layer DAL1, and the second buffer transistor T10 includes a second semiconductor layer DAL2. The first and second semiconductor layers DAL1 and DAL2 may exemplarily be formed integrally with each other. The first and second semiconductor layers DAL1 and DAL2 may be low-temperature polycrystalline silicon (LTPS) layers. However, the present disclosure is not limited thereto. In other words, the first and second semiconductor layers DAL1 and DAL2 may be oxide semiconductor layers.

The first and second semiconductor layers DAL1 and DAL2 may extend to the valley area VLA. Accordingly, the first and second semiconductor layers DAL1 and DAL2 may overlap with the valley area VLA in a plan view. For example, the first and second semiconductor layers DAL1 and DAL2 may overlap with the second valley area VLA2 in a plan view. The first and second semiconductor layers DAL1 and DAL2 may not overlap with the first valley area VLA1 in a plan view.

The first buffer transistor T9 includes a first electrode branched from the first gate driving voltage line VGHL. The first electrode may include a plurality of first branch input electrodes BIE1 branched from the first gate driving voltage line VGHL. Each of the first branch input electrodes BIE1 extends from the first gate driving voltage line VGHL in the first direction DR1, and the first branch input electrodes BIE1 may be separately arrayed in the second direction DR2. The first branch input electrodes BIE1 may overlap with the first semiconductor layer DAL1 in a plan view. For example, the first branch input electrodes BIE1 may contact a first area of the first semiconductor layer DAL1 through first contact holes CNT1.

The first buffer transistor T9 may include a second electrode disposed separately (e.g., to be spaced apart) from the first electrode on the first semiconductor layer DAL1. The second electrode includes a plurality of first branch output electrodes BOE1 disposed separately (e.g., to be spaced apart) from the plurality of first branch input electrodes BIE1. The plurality of first branch output electrodes BOE1 extend in the first direction DR1, and one first branch input electrode BIE1 may be disposed between two separate first branch output electrodes BOE1. For example, the first branch output electrodes BOE1 may contact a second area of the first semiconductor layer DAL1 through second contact holes CNT2.

The control electrode CE1 of the first buffer transistor T9 may include a plurality of first branch control electrodes BCE1 extending in the first direction DR1. Each of the first branch control electrodes BCE1 may be disposed between one first branch input electrode BIE1 and one first branch output electrode BOE1 that face each other.

Accordingly, the first electrode, the second electrode and the control electrode CE1 of the first buffer transistor T9 may be disposed in a branch electrode type, and thus, an entire channel length of the first buffer transistor T9 may be increased. The entire channel length of the first buffer transistor T9 may be increased in a limited space, and thus, operation characteristics of the first buffer transistor T9 may be improved without increasing or substantially increasing the width of the bezel area BZA (e.g., the non-active area NAA).

For example, according to one or more example embodiments of the present disclosure, the first semiconductor layer DAL1 and the first branch control electrodes BCE1 of the first buffer transistor T9 may extend to the second valley area VLA2. Accordingly, the channel length of the first buffer transistor T9 may be increased to improve the operation characteristics of the first buffer transistor T9 without increasing or substantially increasing the width of the bezel area BZA (e.g., the non-active area NAA).

The first buffer transistor T9 may further include a first bridge electrode BL1. The first bridge electrode BL1 may connect the plurality of first branch output electrodes BOE1 to one another. For example, the first bridge electrode BL1 may contact the first branch output electrodes BOE1 through third contact holes CNT3.

As an example embodiment of the present disclosure, the number of the first contact holes CNT1 may be different from that of the second contact holes CNT2. For a non-limiting example, when using one first branch control electrode BCE1 as a reference, the number (e.g., 3) of first contact holes CNT1 provided adjacent to one side of the one first branch control electrode BCE1 may be greater than that of the second contact holes CNT2 (e.g., 1) provided adjacent to the other side thereof.

The first and second electrodes of the first buffer transistor T9 may not overlap with the valley area VLA. Further, the first and second contact holes CNT1 and CNT2 provided to the first and second electrodes also may not overlap with the valley area VLA. The first bridge electrode BL1 overlaps with the first semiconductor layer DAL1 of the first buffer transistor T9 in a plan view.

The second buffer transistor T10 includes a second electrode branched from the second gate driving voltage line VGLL. The second electrode of the second buffer transistor T10 may include a plurality of second branch output electrodes BOE2. Each of the second branch output electrodes BOE2 extends from the second gate driving voltage line VGLL in the first direction DR1, and the second branch output electrodes BOE2 may be separately arrayed in the second direction DR2. The second branch output electrodes BOE2 may overlap with the second semiconductor layer DAL2 in a plan view. For example, the second branch output electrodes BOE2 may contact a second area of the second semiconductor layer DAL2 through fourth contact holes CNT4.

The second buffer transistor T10 may include a first electrode disposed separately (e.g., to be spaced apart) from the second electrode on the second semiconductor layer DAL2. The first electrode of the second buffer transistor T10 includes a plurality of second branch input electrodes BIE2 disposed separately (e.g., to be spaced apart) from the plurality of second branch output electrodes BOE2. The plurality of second branch input electrodes BIE2 extend in the first direction DR1, and one second branch output electrode BOE2 may be disposed between two separate second branch input electrodes BIE2. For example, the second branch input electrodes BIE2 may contact a first area of the second semiconductor layer DAL2 through fifth contact holes CNT5.

The control electrode of the second buffer transistor T10 may include a plurality of second branch control electrodes BCE2 extending in the first direction DR1. Each of the second branch control electrodes BCE2 may be disposed between one second branch input electrode BIE2 and one second branch output electrode BOE2 that face each other.

The first electrode, the second electrode, and the control electrode of the second buffer transistor T10 may also be disposed in a branch electrode type. Further, the second semiconductor layer DAL2 and the second branch control electrodes BCE2 of the second buffer transistor T10 may extend to the second valley area VLA2. Accordingly, a channel length of the second buffer transistor T10 may be increased to improve operation characteristics of the second buffer transistor T10 without increasing or substantially increasing the width of the bezel area BZA (e.g., the non-active area NAA).

The second buffer transistor T10 may further include a second bridge electrode BL2. The second bridge electrode BL2 may connect the plurality of second branch input electrodes BIE2 to one another. The second bridge electrode BL2 may contact the second branch input electrodes BIE2 through sixth contact holes CNT6. The first and second bridge electrodes BL1 and BL2 may be integrally formed with each other.

The first and second electrodes of the second buffer transistor T10 may not overlap with the valley area VLA. Further, the fourth and fifth contact holes CNT4 and CNT5 provided to the first and second electrodes also may not overlap with the valley area VLA.

As illustrated in FIGS. 5A and 5B, the first and second bridge electrodes BL1 and BL2 may overlap with the first and second semiconductor layers DAL1 and DAL2. The first bridge electrode BL1 and the third contact holes CNT3 may not overlap with the valley area VLA, and the second bridge electrode BL2 and the sixth contact holes CNT6 may not overlap with the valley area VLA.

Referring to FIGS. 5B and 6, the display panel DP includes a base layer BL, a display circuit layer DP-CL, and a display element layer DP-OLED. In an embodiment, the base layer BL, the display circuit layer DL-CL, and the display element layer DP-OLED may be sequentially laminated on one another in the third direction DR3.

The base layer BL may be a member (e.g., a layer) for providing a base surface on which the display circuit layer DP-CL is disposed. The base layer BL may be a glass substrate, a metal substrate, a plastic substrate, and/or the like. However, the present disclosure is not limited thereto, and the base layer BL may be an inorganic layer, an organic layer, or a composite material layer.

The display circuit layer DP-CL is disposed on the base layer BL. The display circuit layer DP-CL may include a pixel circuit for driving a pixel PX. The pixel circuit may be disposed at (e.g., in or on) the active area AA, and may include a plurality of pixel transistors TR1 and TR2, a capacitor, and/or the like. For convenience of illustration, FIG. 6 shows only two pixel transistors (hereinafter, first and second pixel transistors) TR1 and TR2, but the present disclosure is not limited thereto. In some embodiments, the first pixel transistor TR1 may include a low-temperature polycrystalline silicon (LTPS) semiconductor layer, and the second pixel transistor TR2 may include an oxide semiconductor layer. For example, in some embodiments, the first pixel transistor TR1 may be a PMOS transistor having a polysilicon semiconductor layer, and the second pixel transistor TR2 may be an NMOS transistor having an oxide semiconductor layer.

The display circuit layer DP-CL may include a driving circuit for driving the pixel circuit. For example, the driving circuit may include the light emission driving circuit 211 and the scan driving circuit 212 illustrated in FIG. 4A. For convenience of illustration, FIG. 6 partially shows the first buffer transistor T9 of the light emission driving circuit 211.

The display circuit layer DP-CL may include a buffer layer BFL disposed on the base layer BL. The buffer layer BFL may include an inorganic material. The buffer layer BFL may prevent or substantially prevent oxygen and/or moisture flowing in through the base layer BL from permeating into the pixels PX. The buffer layer BFL may be composed of a single layer or a plurality of layers.

The first and second pixel transistors TR1 and TR2 may be disposed above the buffer layer BFL in correspondence to the active area AA. The first pixel transistor TR1 includes a first semiconductor pattern AL1, a first gate electrode GE1, a first source electrode SE1, and a first drain electrode DE1. The first semiconductor pattern AL1 may be disposed on the buffer layer BFL. The first semiconductor pattern AL1 may include polysilicon. The first gate electrode GE1 may be spaced apart from the first semiconductor pattern AL1 with a first insulation layer 10 therebetween. The first gate electrode GE1 may be connected to one electrode of a capacitor.

The first source electrode SE1 and the first drain electrode DE1 may be spaced apart from the first gate electrode GE1 with a second insulation layer 20, a third insulation layer 30, and a fourth insulation layer 40 therebetween. The first source electrode SE1 and the first drain electrode DE1 may penetrate (e.g., may extend) through the first to fourth insulation layers 10 to 40 to be connected to corresponding sides (e.g., one side and another side, or a left side and a right side) of the first semiconductor pattern AL1.

An upper electrode UGE may be disposed between the second insulation layer 20 and the third insulation layer 30. The upper electrode UGE may be connected to another electrode of the capacitor. The upper electrode UGE may face the first gate electrode GE1 with the second insulation layer 20 therebetween.

The second pixel transistor TR2 includes a second semiconductor pattern AL2, a second gate electrode GE2, a second source electrode SE2, and a second drain electrode DE2. The second semiconductor pattern AL2 is disposed on the third insulation layer 30. The second semiconductor pattern AL2 may include an oxide semiconductor. The second gate electrode GE2 may be spaced apart from the second semiconductor pattern AL2 with a protection layer PL therebetween.

The second source electrode SE2 and the second drain electrode DE2 may be spaced apart from the second gate electrode GE2 with the fourth insulation layer 40 therebetween. The second source electrode SE2 and the second drain electrode DE2 may penetrate (e.g., may extend) through the fourth insulation layer 40 to be connected to corresponding sides (e.g., one side and another side, or a left side and a right side) of the second semiconductor pattern AL2.

A fifth insulation layer 50 is disposed on the fourth insulation layer 40 to cover the first and second source electrodes SE1 and SE2, and the first and second drain electrodes DE1 and DE2. Each of the first to fifth insulation layers 10 to 50 may include an organic material and/or an inorganic material, and may have a single layer structure or a structure with a plurality of laminated layers.

A connection electrode CNE may be disposed on the fifth insulation layer 50. The connection electrode CNE may be connected to the first drain electrode DE1. A sixth insulation layer 60 may be disposed on the connection electrode CNE.

The first and second pixel transistors TR1 and TR2 according to various embodiments of the present disclosure may be formed in various suitable structures, and are not limited to the embodiment shown in FIG. 6.

The display element layer DP-OLED is disposed on the display circuit layer DP-CL. The display element layer DP-OLED may include a plurality of light emission elements OLED.

The light emission element OLED is disposed on the sixth insulation layer 60. The light emission element OLED may include an anode electrode E1, an emission layer EL, and a cathode electrode E2. The anode electrode E1 may penetrate (e.g., may extend) through the sixth insulation layer 60 to be electrically connected to the first pixel transistor TR1 through the connection electrode CNE.

A seventh insulation layer 70 may be disposed on the sixth insulation layer 60. A pixel opening unit (e.g., a pixel opening) OP may be defined in the seventh insulation layer 70, and the pixel opening unit OP may expose at least a part (e.g., a portion) of the anode electrode E1. For example, the seventh insulation layer 70 may be a pixel definition layer.

The emission layer EL may be disposed on the anode electrode E1 exposed by the pixel opening unit OP defined in the seventh insulation layer 70. The emission layer EL may include a light emitting material. For example, the emission layer EL may be composed of at least any one from among various materials for emitting red, green, or blue light. The emission layer EL may include a fluorescent material or a phosphorescent material. The emission layer EL may include an organic light emitting material or an inorganic light emitting material. The emission layer EL may emit light in response to a potential difference between the anode electrode E1 and the cathode electrode E2.

The cathode electrode E2 may be disposed on the emission layer EL. The cathode electrode E2 may be commonly provided to the plurality of pixels PX (e.g., see FIG. 3B). In other words, the cathode electrode E2 may be entirely formed at (e.g., in or on) the active area AA. The cathode electrode E2 may receive the second driving voltage ELVSS (see FIG. 3B) through the second power line.

The cathode electrode E2 may include a transmissive conductive material or a semi-transmissive conductive material. Accordingly, the light generated in the emission layer EL may be emitted (e.g., easily emitted) through the cathode electrode E2 in the third direction. However, the present disclosure is not limited thereto, and according to a design of the display device DD, the light emitting element OLED may be driven in a bottom emission type in which the anode electrode E1 includes a transmissive or semi-transmissive material, or both-side emissive type in which light is emitted towards both the top surface and bottom surface.

Still referring to FIGS. 5B and 6, the first semiconductor layer DAL1 of the first buffer transistor T9 is disposed on the buffer layer BFL at (e.g., in or on) the non-active area NAA. The first semiconductor layer DAL1 may include polysilicon. The control electrode CE1 (e.g., including the plurality of the first branch control electrodes BCE1) of the first buffer transistor T9 may be spaced apart from the first semiconductor layer DAL1 with the first insulation layer 10 therebetween. The second and third insulation layers 20 and 30 may be sequentially laminated on the control electrode CE1 (e.g., including the plurality of the first branch control electrodes BCE1) of the first buffer transistor T9.

The first bridge electrode BL1 is formed on the third insulation layer 30. The first bridge electrode BL1 may be formed on the same layer as that of the second gate electrode GE2 of the second pixel transistor TR2. The first bridge electrode BL1 is covered by the fourth insulation layer 40, and the first and second electrodes of the first buffer transistor T9 may be disposed on the fourth insulation layer 40. In other words, the first and second electrodes of the first buffer transistor T9 may be formed on the same layer as that of the first and second source electrodes SE1 and SE2, and the first and second drain electrodes DE1 and DE2 of the first and second pixel transistors TR1 and TR2. The first and second gate driving voltage lines VGHL and VGLL, which may include the same or substantially the same material as that of the first and second electrodes of the first buffer transistor T9, may be disposed on the fourth insulation layer 40.

The first and second electrodes of the first buffer transistor T9 and the first and second gate driving voltage lines VGHL and VGLL may be covered by the fifth insulation layer 50. The sixth and seventh insulation layers 60 and 70 are sequentially laminated on the fifth insulation layer 50 at (e.g., in or on) the non-active area NAA. The fifth to seventh insulation layers 50, 60, and 70 may exemplarily include an organic material. In this case, the fifth insulation layer 50 may be defined as a first organic insulation layer, and the sixth insulation layer 60 may be defined as a second organic insulation layer. A part (e.g., a portion) of the first organic insulation layer 50 at (e.g., in or on) the non-active area NAA may be removed to form a first valley VL1, and a part (e.g., a portion) of the second organic insulation layer 60 at (e.g., in or on) the non-active area NAA may be removed to form a second valley VL2.

The second valley VL2 may be provided to have a larger width (e.g., in the first direction DR1) than that of the first valley VL1. The first valley area VLA1 at (e.g., in or on) which the first valley VL1 is formed may not overlap with the first buffer transistor T9. The second valley area VLA2 at (e.g., in or on) which the second valley VL2 is formed may partially overlap with the first buffer transistor T9. For example, the second valley area VLA2 may overlap with the first semiconductor layer DAL1 and the first branch control electrodes BCE1 of the first buffer transistor T9.

The first and second valley areas VLA1 and VLA2 may be covered by an inorganic layer IL. The inorganic layer IL covering the first and second valley areas VAL1 and VLA2 may be exemplarily formed of the same or substantially the same material as that of the anode electrode E1 on the second organic insulation layer 60. However, the present disclosure is not limited thereto. For example, the inorganic layer IL may be formed of the same or substantially the same material as that of the cathode electrode E2 to be disposed on the seventh insulation layer 70.

At (e.g., in or on) the non-active area NAA, a part (e.g., a portion) of the seventh insulation layer 70 may be exemplarily removed in correspondence to the valley area VLA to provide a third valley VL3. The third valley VL3 may have a different width (e.g., in the first direction DR1) from those of the first and second valleys VL1 and VL2. For example, the third valley VL3 may have a width that is larger than that of the first valley VL1 and smaller than that of the second valley VL2. However, the present disclosure is not limited thereto. For example, in some embodiments, the third valley VL3 may have a larger width than those of the first and second valleys VL1 and VL2.

Figure 7:
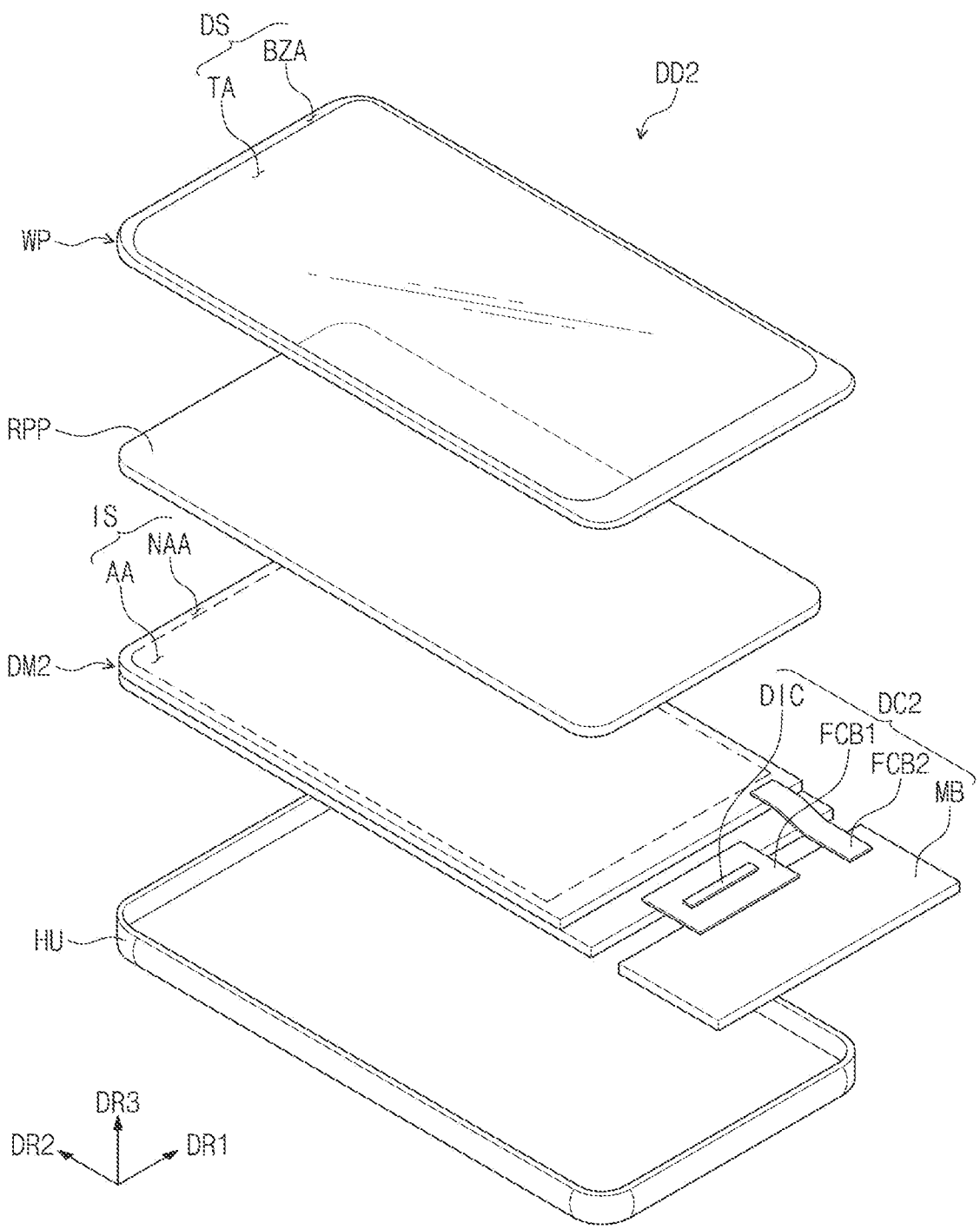
FIG. 7 is an exploded perspective view of a display device according to an embodiment of the present disclosure.
Figure 8:
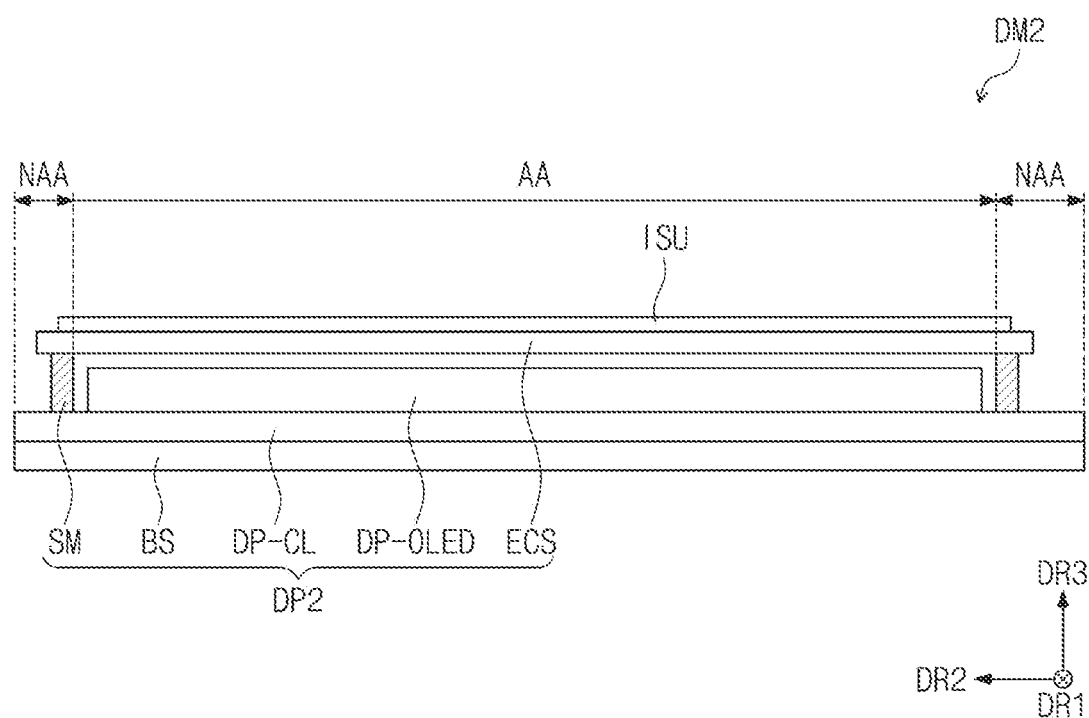
FIG. 8 is a simplified cross-sectional view illustrating the display module shown in FIG. 7.

FIG. 7 is an exploded perspective view of a display device DD2 according to an embodiment of the present disclosure, and FIG. 8 is a simplified cross-sectional view illustrating the display module DM2 illustrated in FIG. 7.

Referring to FIGS. 7 and 8, a display device DD2 according to an embodiment of the present disclosure may include a display module (e.g., a display layer or a display circuit) DM2. The display module DM2 may include a display panel DP2 and an input sensing unit (e.g., an input sensing layer or an input sensing panel) ISU. The display panel DP2 includes a base substrate BS, a display circuit layer DP-CL, a display element layer DP-OLED, an encapsulation substrate ECS, and a sealant SM.

The base substrate BS may be a flexible substrate, and may include a plastic substrate, a glass substrate, a metal substrate, an organic/inorganic composite material substrate, and/or the like. According to an embodiment of the present disclosure, the base substrate BS may include at least one plastic film.

The display circuit layer DP-CL is disposed on the base substrate BS. The display circuit layer DP-CL includes at least one insulation layer, and a circuit element. The insulation layer includes at least one inorganic film, and at least one organic film. The circuit element includes a signal line, a pixel circuit, a driving circuit, and/or the like. The display circuit layer DP-CL may be formed through a process for forming an insulation layer, a semiconductor layer, and a conduction layer by coating, deposition, and/or the like, a photolithography process for the insulation layer and the semiconductor layer, and a patterning process for the conductive layer.

The display element layer DP-OLED may include a light emitting element, a pixel definition layer, and/or the like. The display element layer DP-OLED may be disposed at (e.g., in or on) the active area AA of the display module DM2.

The encapsulation substrate ECS is disposed to face the base substrate BS and to cover the display element layer DP-OLED. The sealant SM is disposed between the encapsulation substrate ECS and the base substrate BS. The sealant SM may be disposed at (e.g., in or on) the non-active area NAA of the display module DM. The encapsulation substrate ECS and the base substrate BS may be combined (e.g., attached to each other) by the sealant SM. The sealant SM may be provided in a closed loop type (e.g., a closed loop shape) to encapsulate a space between the encapsulation substrate ECS and the base substrate BS.

The input sensing unit ISU may be directly disposed on the display panel DP2. According to an embodiment, the input sensing unit ISU may be directly disposed on the encapsulation substrate ECS. As used in this specification, the phrase "directly disposed" refers to forming by a continuous process, and excludes attaching by using a separate adhesive layer.

The input sensing unit ISU includes sensing electrodes, and each of the sensing electrodes may include sensing patterns and sensing lines. The sensing electrodes and the sensing lines may have a single layer structure or a multi-layered structure.

A driving circuit unit (e.g., a driving circuit part) DC2 is electrically connected to the display module DM2. The driving circuit unit DC2 includes a main circuit board MB, a first flexible circuit board FCB1, and a second flexible circuit board FCB2.

The main circuit board MB may include various suitable kinds of driving circuits for driving the display module DM2, connectors for supplying power, and/or the like. The first flexible circuit board FCB1 may be connected to the main circuit board MB and the display panel DP2. The driving circuit unit DC2 may further include a driving chip DIC mounted on the first flexible circuit board FCB1.

The second flexible circuit board FCB2 may be connected to the main circuit board MB and the input sensing unit ISU. In FIG. 7, the first and second flexible circuit boards FCB1 and FCB2 are illustrated as connected to the main circuit board MB, but the present disclosure is not limited thereto. For example, in some embodiments, the driving circuit unit DC2 may include two main circuit boards to which the first and second flexible circuit boards FCB1 and FCB2 are connected, respectively. Redundant descriptions that are the same as the descriptions of FIGS. 1B and 2 are omitted.

Figure 9A:
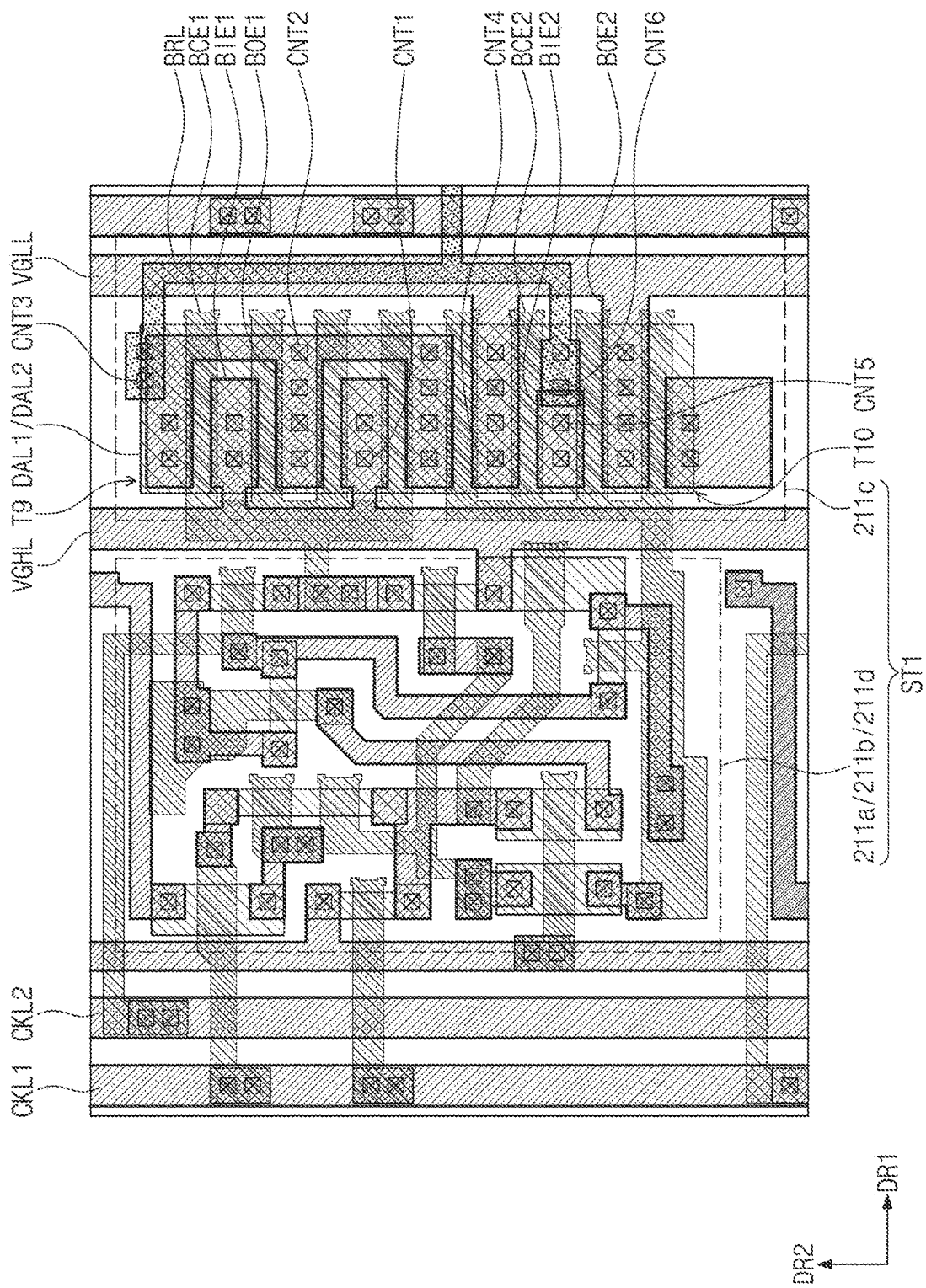
FIG. 9A is a plan view illustrating a layout of a first stage according to an embodiment of the present disclosure.
Figure 9B:
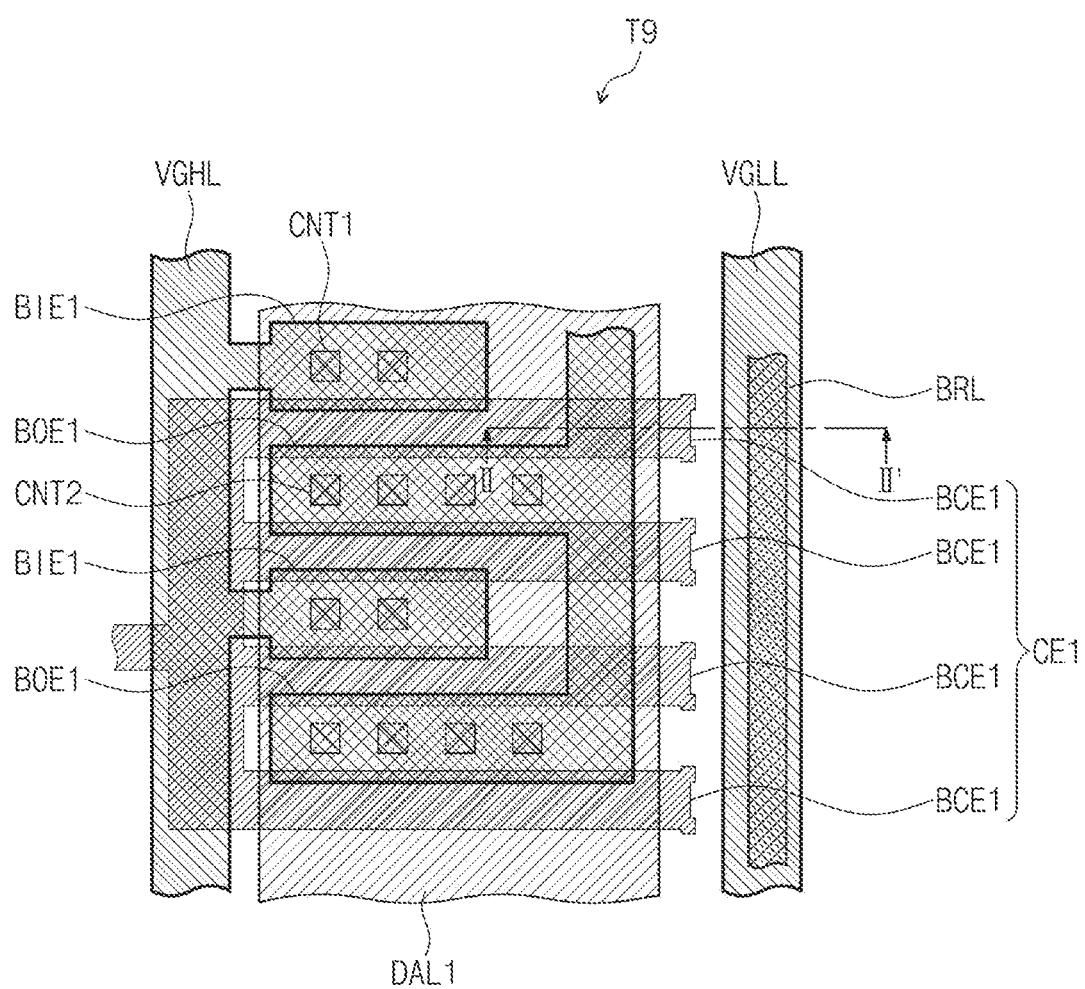
FIG. 9B is an enlarged view of the first buffer transistor illustrated in FIG. 9A.
Figure 10:
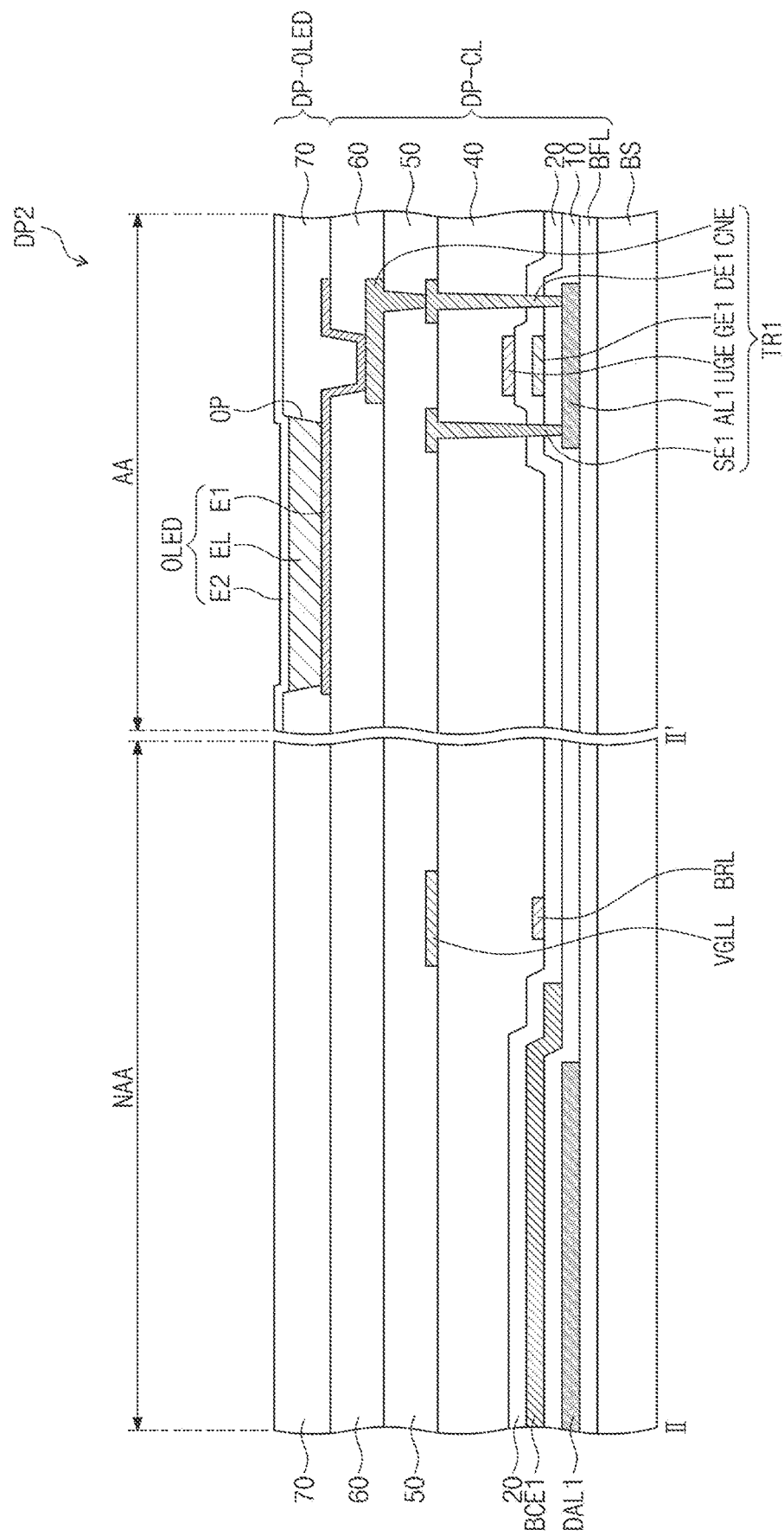
FIG. 10 is a cross-sectional view illustrating a cross-sectional structure of a buffer unit cut along the cutting line II-II' illustrated in FIG. 9B, and a cross-sectional structure of a pixel.

FIG. 9A is a plan view illustrating a layout of a first stage ST1 according to an embodiment of the present disclosure, and FIG. 9B is an enlarged view of the first buffer transistor T9 illustrated in FIG. 9A. FIG. 10 is a cross-sectional view illustrating a cross-sectional structure of a buffer unit 211*c* cut along the cutting line II-II' illustrated in FIG. 9B, and a cross-sectional structure of a pixel PX.

Referring to FIGS. 8, 9A, and 9B, when the sealant SM is disposed at (e.g., in or on) the display panel DP2, the valley area VLA (e.g., see FIG. 3A) may not be provided at (e.g., in or on) the non-active area NAA of the display panel DP2.

However, the present disclosure is not limited thereto. For example, in some embodiments, the valley area VLA as described with reference to FIGS. 1 to 6 may not be provided at (e.g., in or on) the non-active area NAA even in a structure in which the encapsulation layer TFE is included.

The first driving unit 210 (e.g., see FIG. 3B) may be disposed at (e.g., in or on) the non-active area NAA of the display panel DP2, and may include the light emission driving circuit 211 and the scan driving circuit 212, for example, as illustrated in FIG. 4A. Accordingly, redundant description of the light emission driving circuit 211 and the scan driving circuit 212 may not be repeated.

FIG. 9A illustrates the first stage ST1 of the light emission driving circuit 211, when the valley area VLA is not provided at (e.g., in or on) the non-active area NAA of the display panel DP2. As shown in FIG. 9A, the first and second clock lines CKL1 and CKL2 may be disposed at (e.g., in or on) the left side of the first stage ST1, and the second gate driving voltage line VGLL may be disposed at (e.g., in or on) the right side of the first stage ST1. The buffer unit 211c may be disposed between the first gate driving voltage line VGHL and the second gate driving voltage line VGLL. The first to third node control units 211a, 211b, and 211d may be disposed between the second clock line CKL2 and the first gate driving voltage line VGHL.

The buffer unit 211c of the first stage ST1 includes the first buffer transistor T9 and the second buffer transistor T10. The first buffer transistor T9 includes the first semiconductor layer DAL1, and the second buffer transistor T10 includes the second semiconductor layer DAL2. The first and second semiconductor layers DAL1 and DAL2 may be exemplarily formed integrally with each other. The first and second semiconductor layers DAL1 and DAL2 may be LTPS layers. However, the present disclosure is not limited thereto. For example, in some embodiments, the first and second semiconductor layers DAL1 and DAL2 may be oxide semiconductor layers.

The first buffer transistor T9 includes a first electrode branched from the first gate driving voltage line VGHL. The first electrode may include the plurality of first branch input electrodes BIE1. Each of the first branch input electrodes BIE1 extends in the first direction DR1 from the first gate driving voltage line VGHL, and the first branch input electrodes BIE1 may be separately arrayed in the second direction DR2. The first branch input electrodes BIE1 may overlap with the first semiconductor layer DAL1 in a plan view. For example, the first branch input electrodes BIE1 may contact the first area of the first semiconductor layer DAL1 through the first contact holes CNT1.

The first buffer transistor T9 may include a second electrode disposed separately (e.g., to be spaced apart) from the first electrode on the first semiconductor layer DAL1. The second electrode includes the plurality of first branch output electrodes BOE1 disposed separately (e.g., to be spaced apart) from the plurality of first branch input electrodes BIE1. The plurality of first branch output electrodes BOE1 extend in the first direction DR1, and one first branch input electrode BIE1 may be disposed between two separate first branch output electrodes BOE1. For example, the first branch output electrodes BOE1 may contact the second area of the first semiconductor layer DAL1 through the second contact holes CNT2.

The control electrode CE1 of the first buffer transistor T9 may include the plurality of first branch control electrodes BCE1 extending in the first direction DR1. Each of the first branch control electrodes BCE1 may be disposed between one first branch input electrode BIE1 and one first branch output electrode BOE1 that face each other.

As an example embodiment of the present disclosure, the number of the first contact holes CNT1 may be different from that of the second contact holes CNT2. For a non-limiting example, when using one first branch control electrode BCE1 as a reference, the number (e.g., 2) of the first contact holes CNT1 provided adjacent to one side of the one first branch control electrode BCE1 may be smaller than that of the second contact holes CNT2 (e.g., 4) provided adjacent to the other side thereof. In other words, the first contact holes CNT1 and the second contact holes CNT2 may have an asymmetric structure on the basis of the first branched control electrode BCE1.

The second buffer transistor T10 includes a second electrode branched from the second gate driving voltage line VGLL. The second electrode of the second buffer transistor T10 may include the plurality of second branch output electrodes BOE2. Each of the second branch output electrodes BOE2 extends in the first direction DR1 from the second gate driving voltage line VGLL, and the second branch output electrodes BOE2 may be separately arrayed in the second direction DR2. The second branch output electrodes BOE2 may overlap with the second semiconductor layer DAL2 in a plan view. For example, the second branch output electrodes BOE2 may contact the second area of the second semiconductor layer DAL2 through the fourth contact holes CNT4.

The second buffer transistor T10 may include a first electrode disposed separately (e.g., spaced apart) from the second electrode on the second semiconductor layer DAL2. The first electrode of the second buffer transistor T10 includes the plurality of second branch input electrodes BIE2 disposed separately (e.g., spaced apart) from the plurality of second branch output electrodes BOE2. The plurality of second branch input electrodes BIE2 extend in the first direction DR1, and one second branch output electrode BOE2 may be disposed between two separate second branch input electrodes BIE2. For example, the second branch input electrodes BIE2 may contact the first area of the second semiconductor layer DAL2 through the fifth contact holes CNT5.

The control electrode of the second buffer transistor T10 may include the plurality of second branch control electrodes BCE2 extending in the first direction DR1. Each of the second branch control electrodes BCE2 may be disposed between one second branch input electrode BIE2 and one second branch output electrode BOE2 that face each other.

As an example embodiment of the present disclosure, the number of the fourth contact holes CNT4 may be different from the number of the fifth contact holes CNT5. For a non-limiting example, when viewed on the basis of one second branched control electrode BCE2, the number (e.g., four) of the fourth contact holes CNT4 provided adjacent to one side of the one second branched control electrode BCE2 may be greater than that of the fifth contact holes CNT5 (e.g., two) provided adjacent to the other side thereof. In other words, the fourth contact holes CNT4 and the fifth contact holes CNT5 may have an asymmetric structure on the basis of the second branched control electrode BCE2.

Still referring to FIG. 9A, the buffer unit 211c further includes a bridge electrode BRL. The bridge electrode BRL may electrically connect the second electrode of the first buffer transistor T9 and the first electrode of the second buffer transistor T10 to each other. For example, the bridge electrode BRL may contact the second electrode of the first buffer transistor T9 through the third contact hole CNT3, and may contact the first electrode of the second buffer transistor T10 through the sixth contact hole CNT6. The bridge electrode BRL may be defined as an output terminal (e.g., see FIG. 4B) OT of the first stage ST1.

The third and sixth contact holes CNT3 and CNT6 may overlap with the first and second semiconductor layers DAL1 and DAL2 of the first and second buffer transistors T9 and T10 in a plan view. Because the third and sixth contact holes CNT3 and CNT6 may be disposed to overlap with the first and second semiconductor layers DAL1 and DAL2 in a plan view, an increase in the width of the bezel area BZA (e.g., the non-active area NAA) may be prevented or substantially prevented by the third and sixth contact holes CNT3 and CNT6.

Referring to FIGS. 9B and 10, the first semiconductor layer DAL1 of the first buffer transistor T9 is disposed on the buffer layer BFL at (e.g., in or on) the non-active area NAA. The first semiconductor layer DAL1 may include polysilicon. The control electrode CE1 (e.g., including the plurality of the first branch control electrodes BCE1) of the first buffer transistor T9 may be spaced apart from the first semiconductor layer DAL1 with the first insulation layer 10 therebetween. The second insulation layer 20 is laminated on the control electrode CE1 (e.g., including the plurality of the first branch control electrodes BCE1) of the first buffer transistor T9.

The bridge electrode BRL is formed on the second insulation layer 20. The bridge electrode BRL may be formed on the same layer as that of an upper electrode UGE of the first pixel transistor TR1. The bridge electrode BRL is covered by the fourth insulation layer 40, and the first and second electrodes of the first buffer transistor T9 may be disposed on the fourth insulation layer 40. In other words, the first and second electrodes of the first buffer transistor T9 may be formed on the same layer as that of the first source electrode SE1 and the first drain electrode DE1 of the first pixel transistor TR1. The first and second gate driving voltage lines VGHL and VGLL, which may include the same or substantially the same material as those of the first and second electrodes of the first buffer transistor T9, may be disposed on the fourth insulation layer 40. The bridge electrode BRL may overlap with the second gate driving voltage line VGLL in a plan view. When the bridge electrode BRL overlaps with the second gate driving voltage line VGLL in a plan view, an increase in the width of the non-active area NAA may be prevented or substantially prevented by the bridge electrode BRL.

The first and second electrodes of the first buffer transistor T9 and the first and second gate driving voltage lines VGHL and VGLL may be covered by the fifth insulation layer 50. The sixth and seventh insulation layers 60 and 70 may be sequentially laminated on the fifth insulation layer 50 at (e.g., in or on) the non-active area NAA. The fifth to seventh insulation layers 50, 60, and 70 may exemplarily include an organic material. For a rigid display panel DP2, moisture and/or oxygen may be prevented or substantially prevented from being flowed in by the sealant SM, and thus, a valley may not be provided to the fifth to seventh insulation layers 50, 60, and 70.

According to one or more example embodiments of the present disclosure, a first electrode, a second electrode, and a control electrode of a buffer transistor may be disposed in a branch electrode type, and the control electrode and a semiconductor layer of the buffer transistor may extend to a valley region and may overlap with the valley region in a plan view.

Accordingly, the channel length of the buffer transistor may be increased without increasing or substantially increasing the width of the bezel area, and thus, the operation characteristics of the buffer transistor may be improved within a limited bezel area.

Although some exemplary embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising:
    a base layer comprising an active area and a non-active area adjacent to the active area;
    a display circuit layer comprising a pixel circuit at the active area of the base layer, and a driving circuit at the non-active area, the driving circuit being configured to supply a driving signal to the pixel circuit; and
    a display element layer on the display circuit layer and comprising light emitting elements configured to emit light,
    wherein:
        the driving circuit comprises a buffer transistor configured to output the driving signal,
        the display circuit layer comprises a first organic insulation layer, and a second organic insulation layer on the first organic insulation layer,
        the non-active area comprises a first valley area formed by removing a portion of the first organic insulation layer, and a second valley area formed by removing a portion of the second organic insulation layer, and
        the buffer transistor overlaps with the second valley area in a plan view.

2. The display device of claim 1, wherein the first valley area has a smaller width than that of the second valley area, and is located in the second valley area.

3. The display device of claim 1, wherein the buffer transistor comprises a control electrode and a semiconductor layer, and
    at least one of the control electrode or the semiconductor layer overlaps with the second valley area in a plan view.

4. The display device of claim 1, wherein the display element layer further comprise a pixel definition layer on the second organic insulation layer, and a portion of the pixel definition layer is removed in correspondence to the second valley area.

5. The display device of claim 1, wherein the buffer transistor comprises:
    a semiconductor layer on the base layer;
    a control electrode on the semiconductor layer;
    a first electrode connected to a first area of the semiconductor layer; and a second electrode connected to a second area of the semiconductor layer.

6. The display device of claim 5, wherein the first electrode and the second electrode do not overlap with the second valley area in a plan view, and
the semiconductor layer and the control electrode partially overlap with the second valley area in a plan view.

7. The display device of claim 5, wherein the semiconductor layer extends side by side in a first direction in which the second valley area extends,
the first electrode comprises a plurality of branch input electrodes arranged along the first direction,
the second electrode comprises a plurality of branch output electrodes separately arranged along the first direction, and
one branch output electrode from among the plurality of branch output electrodes is arranged between two adjacent branch input electrodes from among the plurality of branch input electrodes.

8. The display device of claim 7, wherein the semiconductor layer is connected to the plurality of branch input electrodes through a plurality of first contact holes,
the semiconductor layer is connected to the plurality of branch output electrodes through a plurality of second contact holes, and
the plurality of first contact holes and the plurality of second contact holes do not overlap with the second valley area in a plan view.

9. The display device of claim 7, wherein the buffer transistor further comprises a bridge electrode to electrically connect the plurality of branch output electrodes to each other.

10. The display device of claim 9, wherein the bridge electrode is connected to the plurality of branch output electrodes through a third contact hole, and
the third contact hole and the bridge electrode overlap with the semiconductor layer in a plan view.

11. The display device of claim 10, wherein the third contact hole does not overlap with the second valley area.

12. The display device of claim 9, wherein the pixel circuit comprises a first pixel transistor, the first pixel transistor comprising:
a first semiconductor pattern at a same layer as that of the semiconductor layer;
a first gate electrode on the first semiconductor pattern;
a first source electrode connected to a first area of the first semiconductor pattern; and
a first drain electrode connected to a second area of the first semiconductor pattern.

13. The display device of claim 12, wherein the semiconductor layer and the first semiconductor pattern comprise a polysilicon semiconductor.

14. The display device of claim 12, wherein the pixel circuit further comprises a second pixel transistor, the second pixel transistor comprising:
a second semiconductor pattern;
a second gate electrode on the second semiconductor pattern;
a second source electrode connected to a first area of the second semiconductor pattern; and
a second drain electrode connected to a second area of the second semiconductor pattern.

15. The display device of claim 14, wherein the second semiconductor pattern comprises an oxide semiconductor, and
the bridge electrode is arranged at a same layer as that of the second gate electrode.

16. The display device of claim 1, further comprising:
an encapsulation layer to cover the display element layer; and
an input sensing unit directly disposed on the encapsulation layer.

\* \* \* \* \*